(12) United States Patent
Yu et al.

(10) Patent No.: US 10,622,429 B2
(45) Date of Patent: Apr. 14, 2020

(54) MICRO DISPLAY DEVICE AND DISPLAY INTEGRATED CIRCUIT

(71) Applicant: LG DISPLAY CO., LTD., Seoul (KR)

(72) Inventors: UnSang Yu, Paju-si (KR); Ho-Jin Kim, Seoul (KR); Gyungmin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/966,260

(22) Filed: Apr. 30, 2018

(65) Prior Publication Data

US 2018/0323247 A1 Nov. 8, 2018

(30) Foreign Application Priority Data

May 2, 2017 (KR) .................. 10-2017-0056187

(51) Int. Cl.
*H01L 27/32* (2006.01)
*H01L 27/12* (2006.01)

(52) U.S. Cl.
CPC ...... *H01L 27/3262* (2013.01); *H01L 27/1229* (2013.01); *H01L 27/3248* (2013.01); *H01L 27/3265* (2013.01)

(58) Field of Classification Search
CPC ... H01L 27/32; H01L 27/324; H01L 27/3248; H01L 27/326; H01L 27/3262; H01L 27/3265; H01L 27/12; H01L 27/122; H01L 27/1229
USPC ............................................... 257/40
See application file for complete search history.

(56) References Cited

U.S. PATENT DOCUMENTS 6,396,147 B1 * 5/2002 Adachi ............... G02F 1/13458
257/347
7,532,148 B2 * 5/2009 Muramatsu ......... H03M 1/1019
250/333

* cited by examiner

*Primary Examiner* — Monica D Harrison
(74) *Attorney, Agent, or Firm* — Morgan, Lewis & Bockius LLP

(57) ABSTRACT

A micro display device and a display integrated circuit are provided. Embodiments of the micro display device includes: a silicon substrate; a pixel array including a plurality of sub-pixels arranged in a pixel array zone of the silicon substrate; and driver circuits positioned in a circuit zone disposed around the pixel array zone of the silicon substrate, in which all or some of transistors in the pixel array zone and transistors in the circuit zone have different current-voltage transmission characteristics, thereby having excellent driving performance and display performance.

18 Claims, 23 Drawing Sheets

MICRO DISPLAY DEVICE AND DISPLAY INTEGRATED CIRCUIT

CROSS REFERENCE TO RELATED APPLICATION

This application claims priority from Korean Patent Application No. 10-2017-0056187, filed on May 2, 2017, which is hereby incorporated by reference for all purposes as is fully set forth herein.

BACKGROUND

1. Technical Field

Embodiments of the present disclosure relate to a display device, and more particularly, to a micro display device and a display integrated circuit.

2. Discussion of the Related Art

A display device includes a display panel having several sub-pixels arranged thereon and various driver circuits for driving the sub-pixels such as a source driver circuit and a gate driver circuit.

In the display panel of display devices of the related art, transistors and various electrodes and signal lines are mounted on a glass plate and driver circuits that can be implemented in an integrated circuit are mounted on a printed circuit and electrically connected to the display panel through the printed circuit.

Such a fundamental structure is suitable for large display devices, but not suitable for small display devices.

Further, recently, various electronic devices requiring small display devices such as a virtual reality device and an augmented reality device have been developed.

However, at present, a small display device having a structure or excellent display performance that is suitable for electronic devices such as a virtual reality device and an augmented reality device has not been developed yet.

SUMMARY

Accordingly, embodiments of the present disclosure are directed to a micro display device and a display integrated circuit that substantially obviate one or more of the problems due to limitations and disadvantages of the related art.

An object of the present disclosure is to provide a micro display device and a display integrated circuit.

Another object of the present disclosure is to provide a micro display device and a display integrated circuit that have excellent driving ability and display performance.

Another object of the present disclosure is provide a micro display device and a display integrated circuit in which a pixel array and driver circuits are all disposed on a silicon substrate.

Another object of the present disclosure is provide a micro display device and a display integrated circuit that have a multi-transistor characteristic.

Another object of the present disclosure is provide a micro display device and a display integrated circuit that have a multi-transistor structure.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a micro display device comprises: a silicon substrate; a pixel array including a plurality of sub-pixels arranged in a pixel array zone of the silicon substrate; and driver circuits disposed in a circuit zone of the silicon substrate.

In the micro display device, the circuit zone may be positioned around the pixel array zone.

All or some of transistors in the pixel array zone and transistors in the circuit zone have different current-voltage transmission characteristics (transistor characteristics).

The current-voltage transmission characteristics of the transistors in the circuit zone show the characteristic (a control characteristic) of current transmitted between a source node and a drain node of a transistor and may be defined as a first current-voltage transmission graph showing a current change according to a voltage change, and the current-voltage transmission characteristics of the transistors in the pixel array zone may be defined as a second current-voltage transmission graph showing a current change according to a voltage change.

The slope in a current change section in the second current-voltage transmission graph may be smaller than the slope in a current change section in the first current-voltage transmission graph.

In the micro display device, the current-voltage transmission characteristic of the transistors in the pixel array zone may be different from the current-voltage transmission characteristic of the transistors in the circuit zone.

In the micro display device, the transistors in the pixel array zone and the transistors in the circuit zone may be different kinds of transistors.

Alternatively, in the micro display device, the transistors in the pixel array zone and the transistors in the circuit zone may be the same kind of transistors.

In this case, the doping concentration of the transistors in the circuit zone and the doping concentration of the transistors in the pixel array zone may be different from each other.

Alternatively, channel characteristic values (or semiconductor characteristic values) of the transistors in the circuit zone and channel characteristic values (or semiconductor characteristic values) of the transistors in the pixel array zone are different from each other.

Alternatively, the doping concentration of the transistors in the circuit zone and the doping concentration of the transistors in the pixel array zone may be different from each other, and the channel characteristic values (or semiconductor characteristic values) of the transistors in the pixel array zone and the channel characteristic values (or semiconductor characteristic values) of the transistors in the circuit zone may also be different from each other.

The channel characteristic values may include one or more of a channel length (or a semiconductor length), a channel width (or a semiconductor width), and a channel thickness (or a semiconductor thickness).

The transistors in the circuit zone may be Metal-Oxide-Semiconductor Field-Effect Transistors (MOSFET) and the transistors in the pixel array zone are Thin Film Transistors (TFT).

The transistors in the circuit zone and the transistors in the pixel array zone may be MOSFETs having different current-voltage transmission characteristics.

In this case, the doping concentration of the transistors in the circuit zone and the doping concentration of the transistors in the pixel array zone may be different from each other.

The doping concentration of the transistors in the circuit zone may be higher than the doping concentration of the transistors in the pixel array zone.

The channel length or semiconductor length of the transistors in the circuit zone and the channel length or semiconductor length of the transistors in the pixel array zone may be different from each other.

The channel length or semiconductor length of the transistors in the circuit zone may be smaller than the channel length or semiconductor length of the transistors in the pixel array zone.

A dummy zone may exist between the circuit zone and the pixel array zone on the silicon substrate, and a dummy pixel including a pixel electrode and a transistor having the same current-voltage transmission characteristic as the transistors in the pixel array zone may exist in the dummy zone of the silicon substrate.

In another aspect, a display integrated circuit comprises: a silicon substrate; a plurality of sub-pixels arranged in a pixel array zone of the silicon substrate; and driver circuits disposed in a circuit zone of the silicon substrate.

In the display integrated circuit, the circuit zone may be positioned around the pixel array zone.

In the display integrated circuit, the current-voltage transmission characteristic of the transistors in the pixel array zone may be different from the current-voltage transmission characteristic of the transistors in the circuit zone.

In the display integrated circuit, the transistors in the pixel array zone and the transistors in the circuit zone may be different kinds of transistors.

In the display integrated circuit, the transistors in the pixel array zone and the transistors in the circuit zone may be the same kind of transistors.

In this case, the doping concentration of the transistors in the circuit zone and the doping concentration of the transistors in the pixel array zone may be different from each other.

Alternatively, the channel length or semiconductor length of the transistors in the pixel array zone and the channel length or semiconductor length of the transistors in the circuit zone may be different from each other.

Alternatively, the doping concentration of the transistors in the circuit zone and the doping concentration of the transistors in the pixel array zone may be different from each other, and the channel length or the semiconductor length of the transistors in the pixel array zone and the channel length or the semiconductor length of the transistors in the circuit zone may also be different from each other.

The embodiments described above can provide a micro display device and a display integrated circuit.

The embodiments can provide a micro display device and a display integrated circuit that have excellent driving ability and display performance.

Embodiments provide a micro display device and a display integrated circuit in which a pixel array and driving circuits are all disposed on a silicon substrate.

The embodiments can provide a micro display device and a display integrated circuit that have a multi-transistor characteristic.

The embodiments can provide a micro display device and a display integrated circuit that have a multi-transistor structure.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
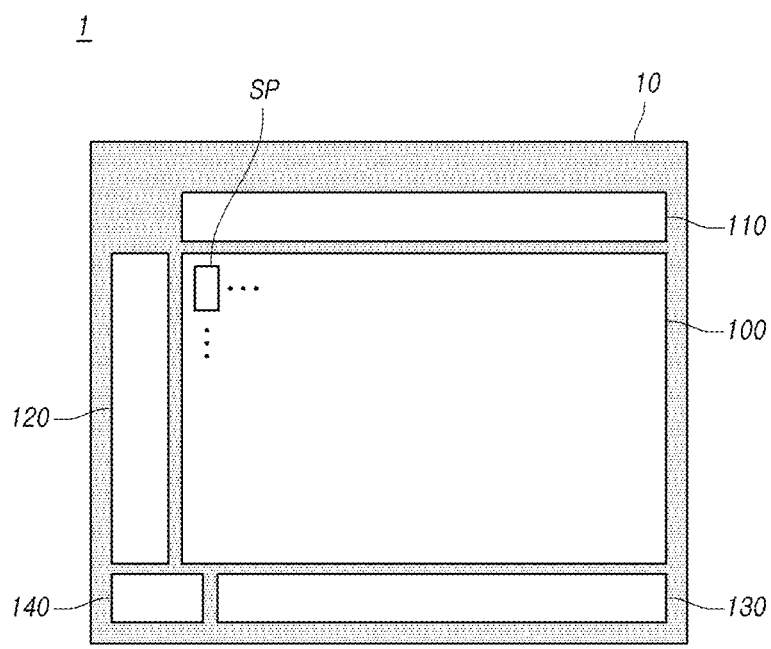
FIG. 1 is a diagram schematically showing a micro display device according to embodiments.

Hereinafter, some embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a diagram schematically showing a micro display device 1 according to embodiments.

Referring to FIG. 1, a micro display device according to embodiments may have a backplane structure in which a pixel array 100 and various driver circuits are disposed on a silicon substrate 10.

In the specification, the term 'micro' may mean that the micro display device 1 is small in size or may mean that the micro display device 1 is not small in size, but is made through a fine manufacturing process.

Figure 2:
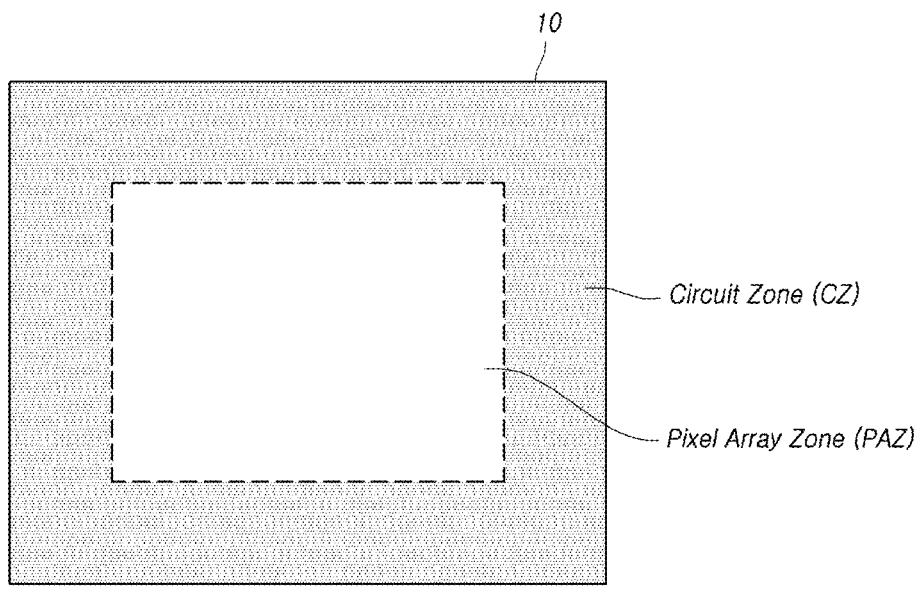
FIG. 2 is a diagram showing two zones of a silicon substrate of the micro display device according to embodiments.

FIG. 2 is a diagram showing two zones of a silicon substrate 10 of the micro display device 1 according to embodiments.

The silicon substrate 10 may be a p-type or an n-type substrate. In the specification, "p" means a hole and "n" means an electron.

The silicon substrate 10 may have a pixel array zone PAZ and a circuit zone CZ.

Accordingly, the micro display device 1 according to embodiments may include a pixel array 100 of several sub-pixels SP arranged on the pixel array zone PAZ of the silicon substrate 10 and driver circuits disposed in the circuit zone CZ of the silicon substrate 10.

The circuit zone CZ of the silicon substrate 10 may be positioned around the pixel array zone PAZ of the silicon substrate 10.

In the pixel array zone PAZ of the silicon substrate 10, not only a several sub-pixels SP, but signal lines for supplying various signals and voltage to the sub-pixels SP may be disposed.

The signal lines may include data lines for transmitting data voltage corresponding to an image signal and gate lines for transmitting a scan signal (gate signal).

The signal lines disposed in the pixel array zone PAZ of the silicon substrate 10 may further include a driving voltage line for transmitting driving voltage, and depending on cases, the signal lines may further include a sense line for transmitting reference voltage or sensing voltage.

The signal lines disposed in the pixel array zone PAZ of the silicon substrate 10 may be electrically connected to the driver circuits disposed in the circuit zone CZ of the silicon substrate 10.

The driver circuits disposed in the circuit zone CZ of the silicon substrate 10 may include a source driver circuit 110 for driving data lines, a gate driver circuit 120 for driving gate lines, and a control circuit 130 controlling the operations of the source driver circuit 110, the gate driver circuit 120 etc.

The source driver circuit 110 is also called a data driver circuit or a Source Driver IC (SDIC). The gate driver circuit 120 is also called a scan driver circuit or a Gate Driver IC (GDIC). The control circuit 130 may be a timing controller or a controller including a timing controller.

The driver circuits disposed in the circuit zone CZ of the silicon substrate 10 may further include a power circuit 140 etc. for supplying various signals and voltages for driving the sub-pixels SP arranged in the pixel array zone PAZ of the silicon substrate 10 to other circuits 110, 120, and 130 or to the pixel array 100.

The power circuit 140 may include a power generator such as a DC-DC converter.

The driver circuits disposed in the circuit zone CZ of the silicon substrate 10 may further include one or more interfaces for electrical connection, signal input/output, or communication with other electronic components.

The interfaces, for example, may include one or more of a Low-Voltage Differential Signaling (LVDS) interface, a Mobile Industry Processor Interface (MIPI), and a serial interface.

According to the above description, since not only the pixel array 100, but the driver circuits such as the source driver circuit 110, the gate driver circuit 120, the control circuit 130, and the power circuit 140 are all disposed on the silicon substrate 10, it is possible to reduce the device size and quickly and easily perform the manufacturing process.

The circuit zone CZ may be formed at one side, two side, or three sides of the pixel array zone PAZ or may be formed around the outer side of the pixel array zone PAZ.

The source driver circuit 110 may be formed at only one side or two sides (over and under or left and right) of the pixel array zone PAZ.

The gate driver circuit 120 may be formed at only one side or two sides (left and right or over and under) of the pixel array zone PAZ.

Figure 3:
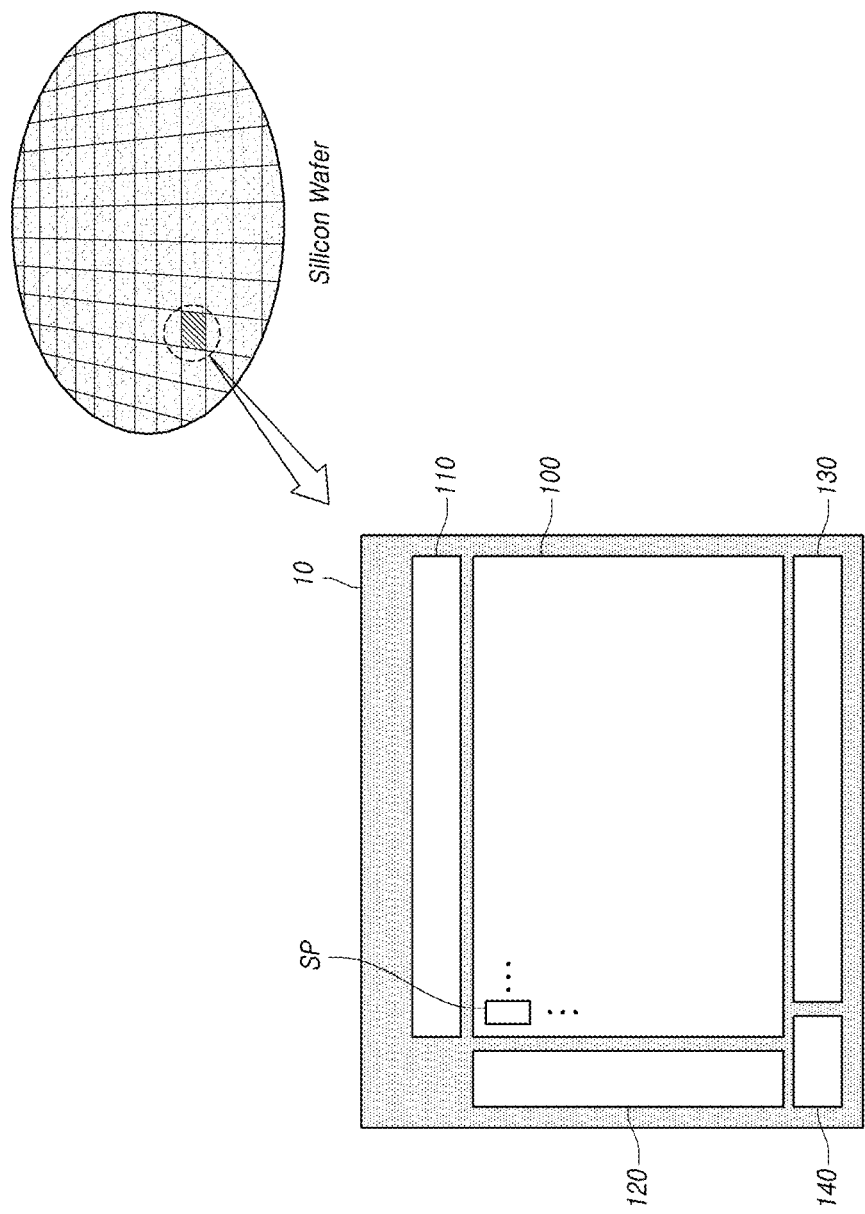
FIG. 3 is a diagram showing the micro display device and a silicon wafer according to embodiments.

FIG. 3 is a diagram showing the micro display device 1 and a silicon wafer according to embodiments.

The entire or a portion of the micro display device 1 according to various embodiments briefly described above may be manufactured through the manufacturing process of a silicon wafer.

In this respect, the entire or a portion of the micro display device 1 according to various embodiments may be considered as a kind of integrated circuit that is formed through a silicon wafer manufacturing process (a semiconductor process).

Accordingly, the entire or a portion of the micro display device 1 according to various embodiments can be called a display integrated circuit.

For example, the display integrated circuit according to embodiments may include a silicon substrate 10, sub-pixels SP arranged in a pixel array zone PAZ of the silicon substrate 10, and driver circuits disposed in a circuit zone CZ formed around the pixel array zone PAZ of the silicon substrate 10.

As described above, since the entire or a portion of the micro display device 1 according to various embodiments is formed through a silicon wafer manufacturing process, the device can be precisely, easily, and conveniently manufactured.

The micro display device 1 according to various embodiments may be an Organic Light Emitting Diode (OLED) display or may be other types of display such as a Liquid Crystal Display.

The micro display device 1 according to various embodiments is assumed as an OLED display in the following description.

Figure 4:
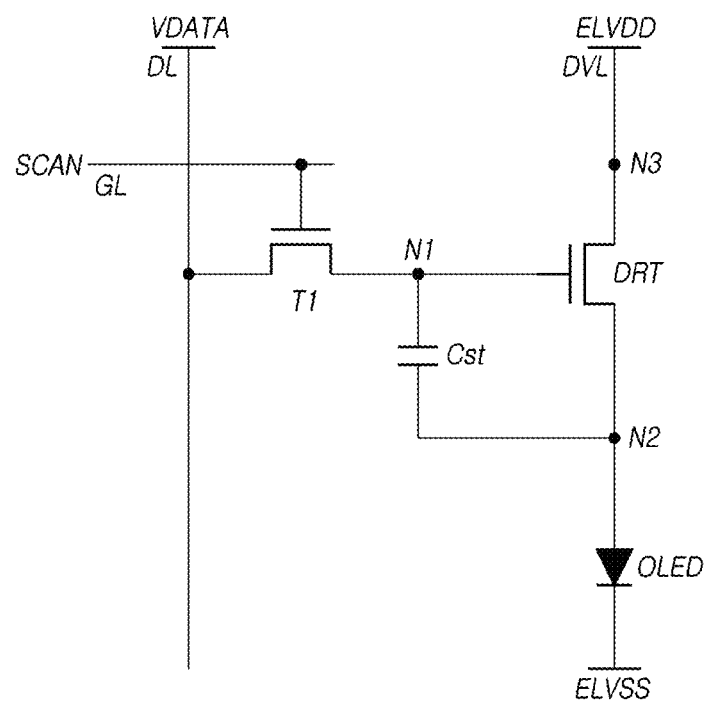
FIG. 4 is an exemplary diagram showing the structure of a sub-pixel of the micro display device according to embodiments.

FIG. 4 is an exemplary diagram showing the structure of a sub-pixel of the micro display device 1 according to embodiments.

In the micro display device 1 according to embodiments, a plurality of sub-pixels SP each may include an organic light emitting diode OLED, a driver transistor DRT for driving the organic light emitting diode OLED, a first transistor T1 electrically connected between a data line DL and a first node N1 that is the gate node of the driver transistor DRT, and a capacitor Cst electrically connected between the first node N1 of the driver transistor DRT and a second node N2 that is the source node or the drain node of the driver transistor DRT.

The organic light emitting diode OLED may be composed of a first electrode, an organic light emitting layer, and a second electrode.

The first electrode of the organic light emitting diode OLED may be an anode (or a cathode) and the second electrode of the organic light emitting diode OLED may be a cathode (or an anode).

A base voltage ELVSS may be applied to the second electrode of the organic light emitting diode OLED.

The driver transistor DRT includes a first node N1, a second node N2, and a third node N3 that are electrical nodes.

In the driver transistor DRT, the first node N1 is a gate node and may be electrically connected to the source node or the drain node of the first transistor T1. The second node N2 is a source node or a drain node and may be electrically connected to the first electrode of the organic light emitting diode OLED. The third node N3 is electrically connected to a driving voltage line DVL and can receive a driving voltage ELVDD.

The first transistor T1 is turned on/off by a scan signal SCAN that is applied to the gate node through a gate line GL and may be electrically connected between the a data line DL and the first node N1 of the driver transistor DRT.

In the first transistor T1, the gate node may be electrically connected to the gate line GL, the drain node or the source node may be electrically connected to the data line DL, and the source node or the drain node may be electrically connected to the first node N1 of the driver transistor DRT.

The first transistor T1 is turned on by a scan signal SCAN and can transmit data voltage VDATA supplied through the data line DL to the first node N1 of the driver transistor DRT.

Figure 5:
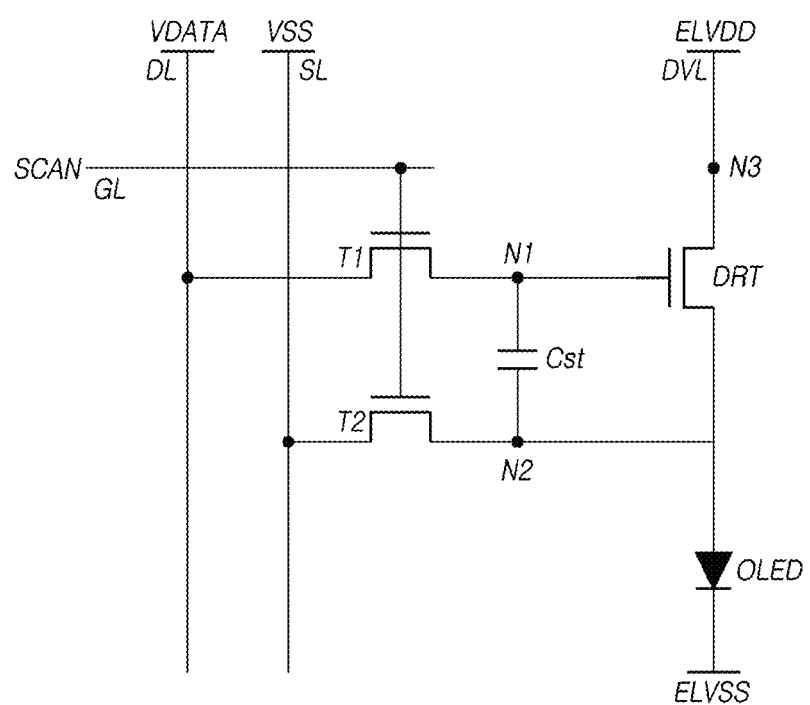
FIG. 5 is another exemplary diagram showing the structure of a sub-pixel of the micro display device according to embodiments.

FIG. 5 is another exemplary diagram showing the structure of a sub-pixel of the micro display device 1 according to embodiments.

Referring to FIG. 5, in the micro display device 1 according to embodiments, the sub-pixels SP each may further include a second transistor T2 electrically connected between a sense line SL and the second node N2 of the driver transistor DRT.

In the second transistor T2, the gate node may be electrically connected to the gate line GL, the drain node or the source node may be electrically connected to the sense line SL, and the source node or the drain node may be electrically connected to the second node N2 of the driver transistor DRT.

The second transistor T2 can be controlled to be turned on/off by a scan signal SCAN that is supplied to the gate node.

In the structure of a sub-pixel shown in FIG. 5, the gate node of the first transistor T1 and the gate node of the second transistor T2 may be electrically connected to each other and both may be connected to one gate line GL.

In this case, the gate node of the first transistor T1 and the gate node of the second transistor T2 can receive together a scan signal SCAN.

Or, the gate node of the first transistor T1 and the gate node of the second transistor T2 may be separately connected to different gate lines GL.

In this case, the gate node of the first transistor T1 and the gate node of the second transistor T2 can separately receive a scan signal SCAN.

The second transistor T2 can be turned on and apply reference voltage VSS to the second node N2 of the driver transistor DRT.

The second transistor T2 can also be turned off and electrically float the second node N2 of the driver transistor DRT.

As described above, it is possible to control the voltage state at the second node N2 of the driver transistor DRT to fit to the driving kind and the driving situation through the second transistor T2 and the sense line SL.

The driver transistor DRT, the first transistor T1, and the second transistor T2 may be n-type or p-type transistors.

A storage capacitor Cst is not a parasitic capacitor (e.g., Csg, Cgd) that is an internal capacitor disposed between the first node N1 and the second node N2 of the driver transistor DRT, but an external capacitor intentionally designed outside the driver transistor DRT.

The pixel array 100 including the transistors in the pixel array zone PAZ on the silicon substrate 10 and the driver circuits including the transistors in the circuit zone CZ on the silicon substrate 10 may be manufactured through the same process.

In this case, the current-voltage transmission characteristic of the transistors in the pixel array zone PAZ on the silicon substrate 10 (transistor performance or a transistor characteristic) and the current-voltage transmission characteristic of the transistors in the circuit zone CZ on the silicon substrate 10 (transistor performance or a transistor characteristic) may be the same or substantially the same.

In the specification, the fact that the current-voltage transmission characteristics are the same means that the current-voltage transmission characteristics (or current-voltage transmission characteristic values) of transistors may not be completely the same, but they are considered as being the same if the difference is small within a tolerance range due to a process error etc. For example, the tolerance range may be ±1%, ±2%, ±5% etc.

For example, the transistors in the pixel array zone PAZ on the silicon substrate 10 and the transistors in the circuit zone CZ on the silicon substrate 10 may be manufactured in the structure of a silicon single crystal metal-oxide-semiconductor field-effect transistor (hereafter, referred to as a "MOSFET") such as a silicon single crystal complementary metal-oxide semiconductor (hereafter, referred to as a "CMOS").

In this case, the driver circuits require high-mobility and high-performance transistors, so it may be preferable that driver circuits are composed of high-mobility and high-performance silicon single crystal MOSFETs.

However, the pixel array 100 requires low-mobility and low-performance transistors, so when the pixel array 100 is composed of high-mobility and high-performance silicon single crystal MOSFETs, it is difficult to control gradation expression, that is, the display performance may be deteriorated.

Accordingly, a micro display device 1 that has a multi-transistor characteristic (multi-transistor composition) in consideration of the operations, functions, and characteristics of the pixel array 100 and the driver circuits even though the pixel array 100 and the driver circuits are all disposed on the silicon substrate 10 is described hereafter.

That is, in the micro display device 1 according to embodiments, the transistors in the pixel array zone PAZ and the transistors in the circuit zone CZ may have different current-voltage transmission characteristics.

Figure 6:
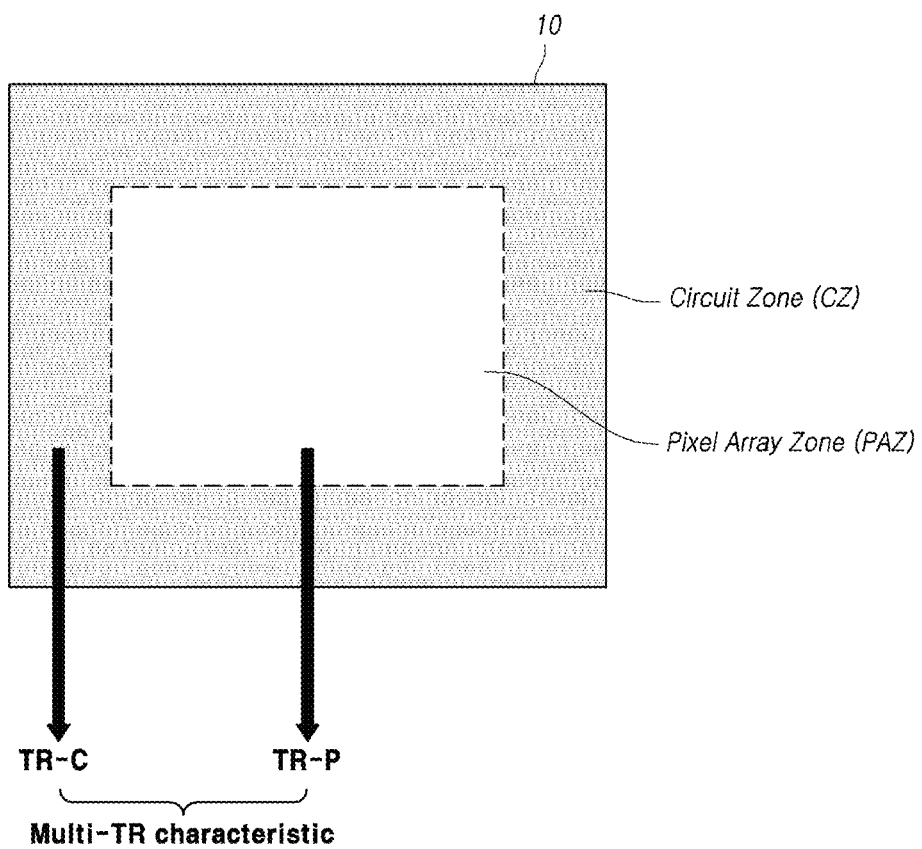
FIG. 6 is a diagram illustrating the multi-transistor characteristic of the micro display device according to embodiments.

FIG. 6 is a diagram illustrating the multi-transistor characteristic of the micro display device 1 according to embodiments.

Referring to FIG. 6, the current-voltage transmission characteristic of a transistor TR-P in the pixel array zone PAZ and the current-voltage transmission characteristic of a transistor TR-C in the circuit zone CZ may be different.

In other words, the micro display device 1 according to embodiments may have a multi-transistor (multi-TR) characteristic.

The current-voltage transmission characteristic (I-V transmission characteristic), for example, may be referred to as mobility, an electrical characteristic, a transistor characteristic, transistor performance, a switch characteristic, a channel characteristic, and a current-voltage driving characteristic.

As described above, by differently designing the current-voltage transmission characteristic of the transistor TR-P in the pixel array zone PAZ of the silicon substrate 10 and the current-voltage transmission characteristic of the transistor TR-C in the circuit zone CZ of the silicon substrate 10, the display performance (e.g., gradation expression ability) of the pixel array 100 can be increased with the high driving performance of the driver circuits.

Figure 7:
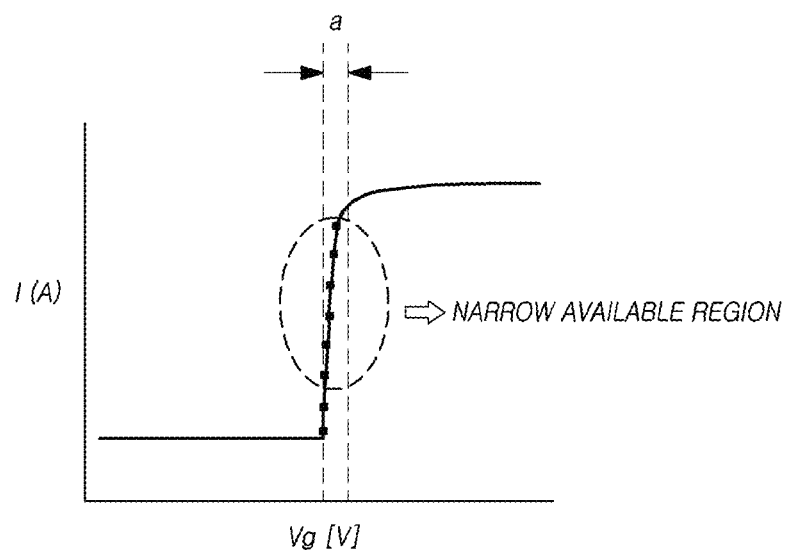
FIG. 7 is an I-V transmission graph showing a current-voltage characteristic (a transistor characteristic) of a transistor in the circuit zone in the micro display device according to embodiments.
Figure 8:
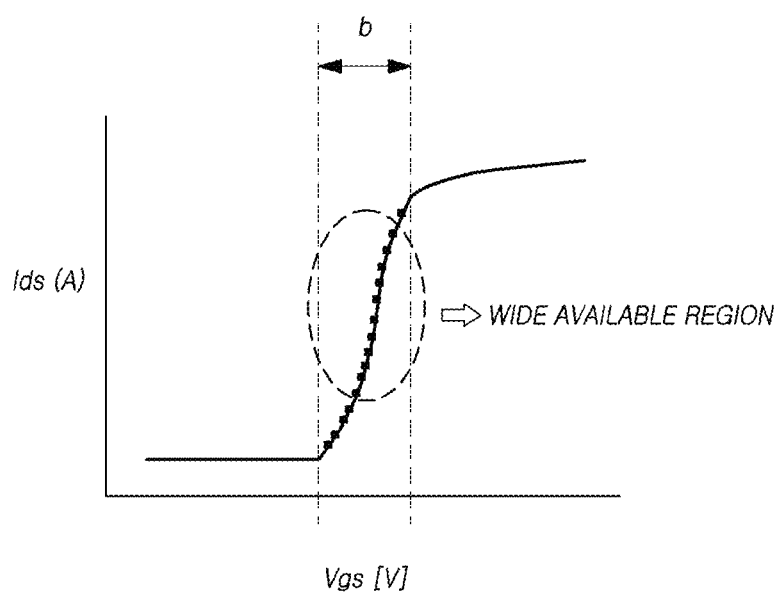
FIG. 8 is an I-V transmission graph showing a current-voltage characteristic (a transistor characteristic) of a transistor in the pixel array zone in the micro display device according to embodiments.

FIG. 7 is an I-V transmission graph showing the current-voltage transmission characteristic (current-voltage transmission characteristic 1) of the transistor TR-C in the circuit zone CZ in the micro display device 1 according to embodiments and FIG. 8 is an I-V transmission graph showing the current-voltage transmission characteristic (current-voltage transmission characteristic 2) of the transistor TR-P in the pixel array zone PAZ in the micro display device 1 according to embodiments.

FIG. 7 is an I-V transmission graph showing a change of current I according to a change of gate voltage Vg for the transistor TR-C in the circuit zone CZ of the silicon substrate 10.

That is, the current-voltage transmission characteristic (current-voltage transmission characteristic 1) of the transistor TR-C in the circuit zone CZ may be defined as a first current-voltage transmission graph showing a current change according to a voltage change, as in FIG. 7.

FIG. 8 is an I-V transmission graph showing a change of current Ids according to a change of gate voltage Vgs for the transistor TR-P in the pixel array zone PAZ of the silicon substrate 10.

That is, the current-voltage transmission characteristic (current-voltage transmission characteristic 2) of the transistor TR-P in the pixel array zone PAZ may be defined as a second current-voltage transmission graph showing a current change according to a voltage change, as in FIG. 8.

As shown in FIGS. 7 and 8, the slope in a current change section b in the second current-voltage transmission graph of the transistor TR-P in the pixel array zone PAZ may be smaller than the slope in a current change section a in the first current-voltage transmission graph of the transistor TR-C in the circuit zone CZ.

In other words, as shown in FIG. 7, according to the first current-voltage transmission graph of the transistor TR-C in the circuit zone CZ, the transistor TR-C in the circuit zone CZ has a narrow available region (a narrow region where current changes in accordance with a voltage change, that is, current change section a).

However, as shown in FIG. 8, according to the second current-voltage transmission graph of the transistor TR-P in the pixel array zone PAZ, the transistor TR-P in the pixel array zone PAZ has a wide available region (a wide region where current changes in accordance with a voltage change, that is, current change section b).

Accordingly, since the transistor TR-P in the pixel array zone PAZ has a wide available region, it is possible to more easily adjust the current Ids by adjusting the voltage Vgs. Therefore, the magnitude of current flow in an organic light emitting diode OLED can be more precisely controlled, so the display performance such as gradation expression ability can be improved.

Two exemplary multi-transistor structures in which the structures of the transistor TR-C in the circuit zone CZ and the transistor TR-P in the pixel array zone PAZ are differently designed to achieve the multi-transistor characteristic (multi-current-voltage transmission characteristic) are described hereafter.

Figure 9:
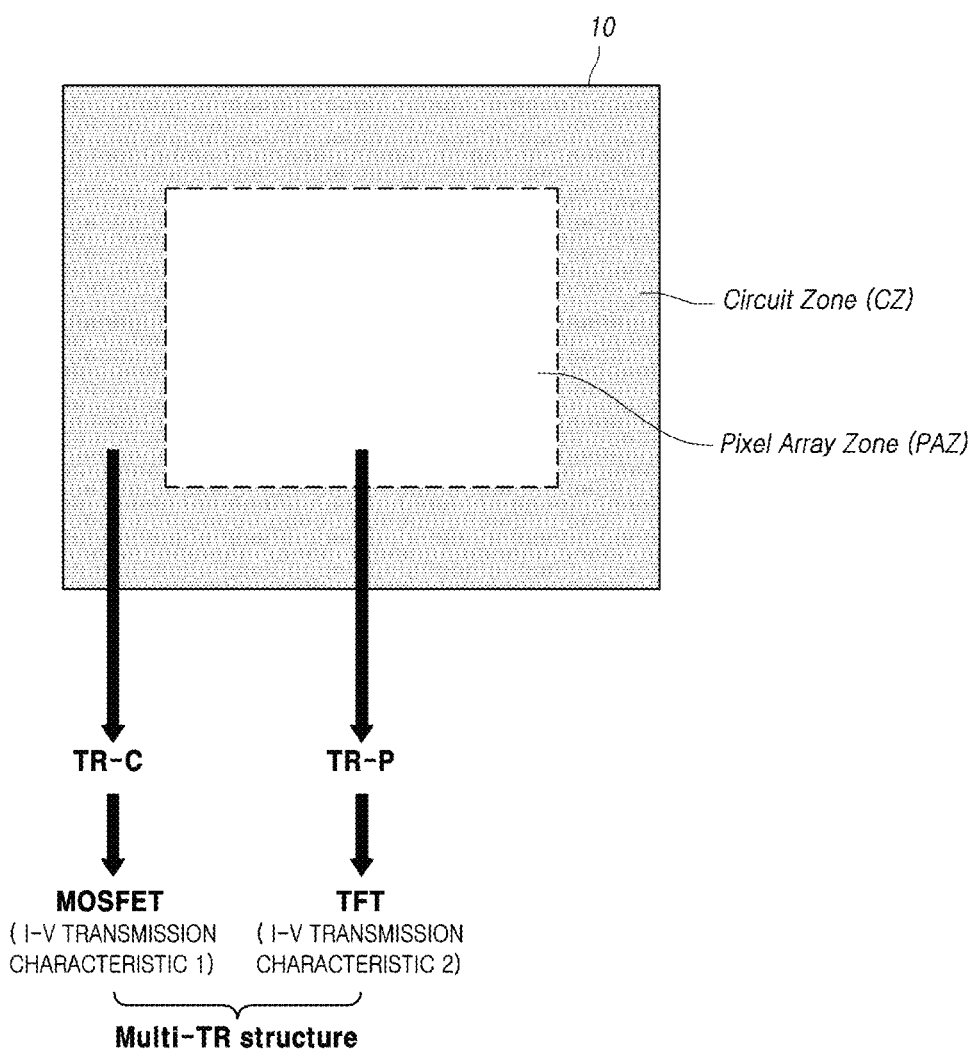
FIG. 9 is a diagram illustrating a first multi-transistor structure of the micro display device according to embodiments.
Figure 10:
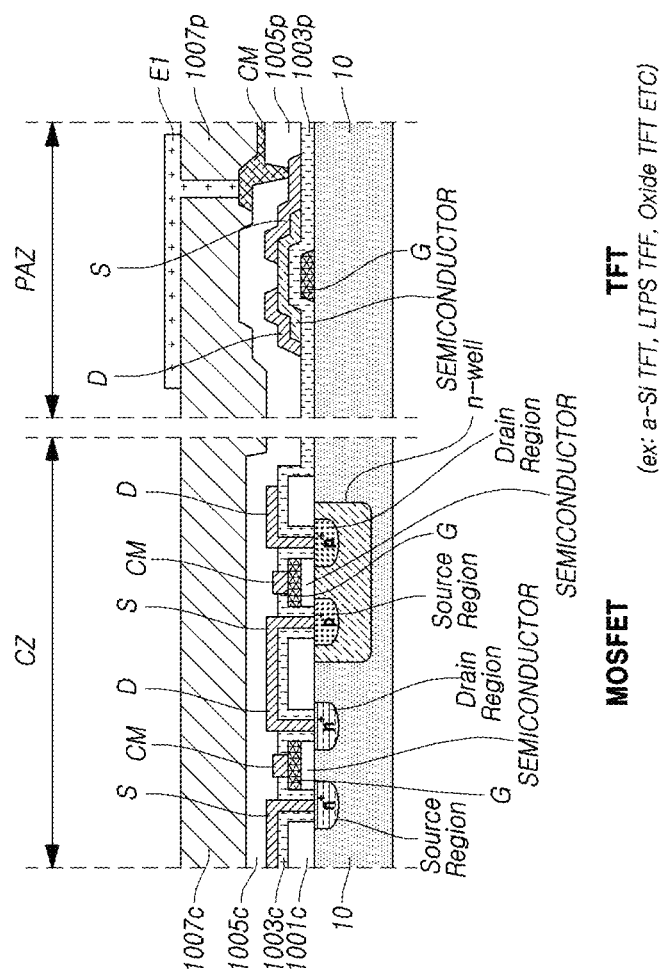
FIG. 10 is an exemplary cross-sectional view showing a first multi-transistor structure of the micro display device according to embodiments.

FIG. 9 is a diagram illustrating a first multi-transistor structure of the micro display device according to embodiments and FIG. 10 is a cross-sectional view exemplary showing the first multi-transistor structure of the micro display device 1 according to embodiments.

The first multi-transistor structure is a multi-transistor structure in which the transistor TR-C in the circuit zone CZ is designed in the kind (type) of transistor having the current-voltage transmission characteristic 1 (FIG. 7) and the transistor TR-P in the pixel array zone PAZ is designed in the kind (type) of transistor having the current-voltage transmission characteristic 2 (FIG. 8).

As exemplified in FIGS. 9 and 10, as an example of the first multi-transistor structure, the transistor TR-C in the circuit zone CZ is a MOSFET having the current-voltage transmission characteristic (FIG. 7). The transistor TR-P in the pixel array zone PAZ may be a thin film transistor (hereafter, referred to as a "TFT") having the current-voltage transmission characteristic 2 (FIG. 8).

However, in this embodiment, the TFT is formed not on a glass substrate, but on the silicon substrate 10.

The MOSFET and the TFT are different in fundamental principle operation. For example, the step where current starts to flow may be different in the MOSFET and the TFT. That is, current flows in an accumulation step in the TFT, but current flows in an inversion step in the MOSFET.

Accordingly, it is possible to increase the display performance (e.g., gradation expression ability) by designing the transistor TR-P in the pixel array zone PAZ of the silicon substrate 10 as a TFT that can have the current-voltage transmission characteristic 2.

The transistor TR-P in the pixel array zone PAZ is a TFT and may be one of various TFTs such as an amorphous silicon TFT, a poly silicon TFT such as a Low-Temperature Polycrystalline Silicon (LTPS), an oxide TFT, and an organic TFT, depending on the semiconductor (channel) characteristic and kind.

Further, the transistor TR-P in the pixel array zone PAZ may be various types of TFTs such as a staggered type TFT, a planar type TFT, a coplanar type TFT, and inverted coplanar type TFT in terms of structure.

Further, the transistor TR-P in the pixel array zone PAZ may be a top gate TFT or a bottom gate TFT, depending on the gate position.

According to the above description, it is possible to increase the display performance (e.g., gradation expression ability) of the pixel array 100 by designing the transistor TR-P in the pixel array zone PAZ of the silicon substrate 10 as various TFTs suitable for displaying.

The cross-sectional structures of the circuit zone CZ and the pixel array zone PAZ are described with reference to FIG. 10.

First, the cross-sectional structure of the circuit zone CZ of the silicon substrate 10 is described.

For example, the silicon substrate 10 is a p-substrate.

On the silicon substrate 10, a first circuit-side insulating layer 1001c is disposed and a semiconductor is disposed in a region where there is no first circuit-side insulating layer 1001c.

A gate electrode G is disposed on the semiconductor.

A second circuit-side insulating layer 1003c is disposed over the first circuit-side insulating layer 1001c and the gate electrode G.

A source electrode S and a drain electrode D are formed by a contact hole formed through the second circuit-side insulating layer 1003c, and an n+ source region, an n+ drain region, a p+ source region, and a p+ drain region are formed at positions corresponding to the source electrode S and the drain electrode D on the silicon substrate 10.

A contact metal CM is connected to the gate electrode G through a contact hole formed through the second circuit-side insulating layer 1003c.

A third circuit-side insulating layer 1005c is formed thereon.

A circuit-side planarization layer 1007c is formed on the third circuit-side insulating layer 1005c.

The transistor TR-C in the circuit zone CZ of the silicon substrate 10 shown in FIG. 10 is a CMOS including an n-channel MOSFET (n-MOS transistor) and a p-channel MOSFET (p-MOS transistor).

The n-channel is formed between the n+ source region and the n+ drain region. The p-channel is formed between the p+ source region and the p+ drain region.

The MOSFET may be formed directly on the silicon substrate 10, but may be formed in a well. The well may be a p-well (p-type well) or an n-well (n-type well), depending on the type (n-type or p-type) of the silicon substrate 10 and the type of the MOSFET.

For example, as shown in FIG. 10, in order to form a p-channel MOSFET on the p-type silicon substrate 10, an n-well (n-type well) corresponding to an n-type region (n-region) is formed on the p-type silicon substrate 10 and a p-channel MOSFET is formed on the n-well.

Accordingly, in the region where the p-channel MOSFET (p-MOS transistor) is formed, an n-well may exist outside the p+ source region and the p+ drain region.

Accordingly, in order to form an n-channel MOSFET on the n-type silicon substrate 10, a p-well (p-type well) corresponding to a p-type region (p-region) is formed on the n-type silicon substrate 10 and an re-channel MOSFET is formed on the p-well.

Next, the cross-sectional structure of the pixel array zone PAZ of the silicon substrate 10 is described.

A gate electrode G is disposed on the silicon substrate 10.

A second pixel-side insulating layer 1003p is disposed over the gate electrode G.

A semiconductor (e.g., a-Si) is disposed on the second pixel-side insulating layer 1003p. The semiconductor (e.g., a-Si) and the gate electrode G vertically overlap each other.

A source electrode S and a drain electrode D are formed at first and second ends of the semiconductor (e.g., a-Si), respectively.

A third pixel-side insulating layer 1005p is formed thereon.

The contact metal CM is connected to the source electrode S or the drain electrode D through a contact hole formed through the third pixel-side insulating layer 1005p.

A pixel-side planarization layer 1007p is formed thereon.

A first electrode E1 that may be the anode of an organic light emitting diode OLED is connected to the contact metal CM through the contact hole of the pixel-side planarization layer 1007p, so it can be connected to the source electrode S or the drain electrode D.

The TFT that is the transistor TR-P in the pixel array zone PAZ of the silicon substrate 10 shown in FIG. 10 may be one of various TFTs such as an amorphous silicon TFT (a-Si), a poly silicon TFT such as a Low-Temperature Polycrystalline Silicon (LTPS), an oxide TFT, and an organic TFT, depending on the semiconductor (channel) characteristic and kind.

The second circuit-side insulating layer 1003c and the second pixel-side insulating layer 1003p may be the same layers that are made in the same process or may be different layers that are made in different processes.

The third circuit-side insulating layer 1005c and the third pixel-side insulating layer 1005p may be the same layers that are made in the same process or may be different layers that are made in different processes.

The circuit-side planarization layer 1007c and the pixel-side planarization layer 1007p may be the same layers that are made in the same process or may be different layers that are made in different processes.

Figure 11:
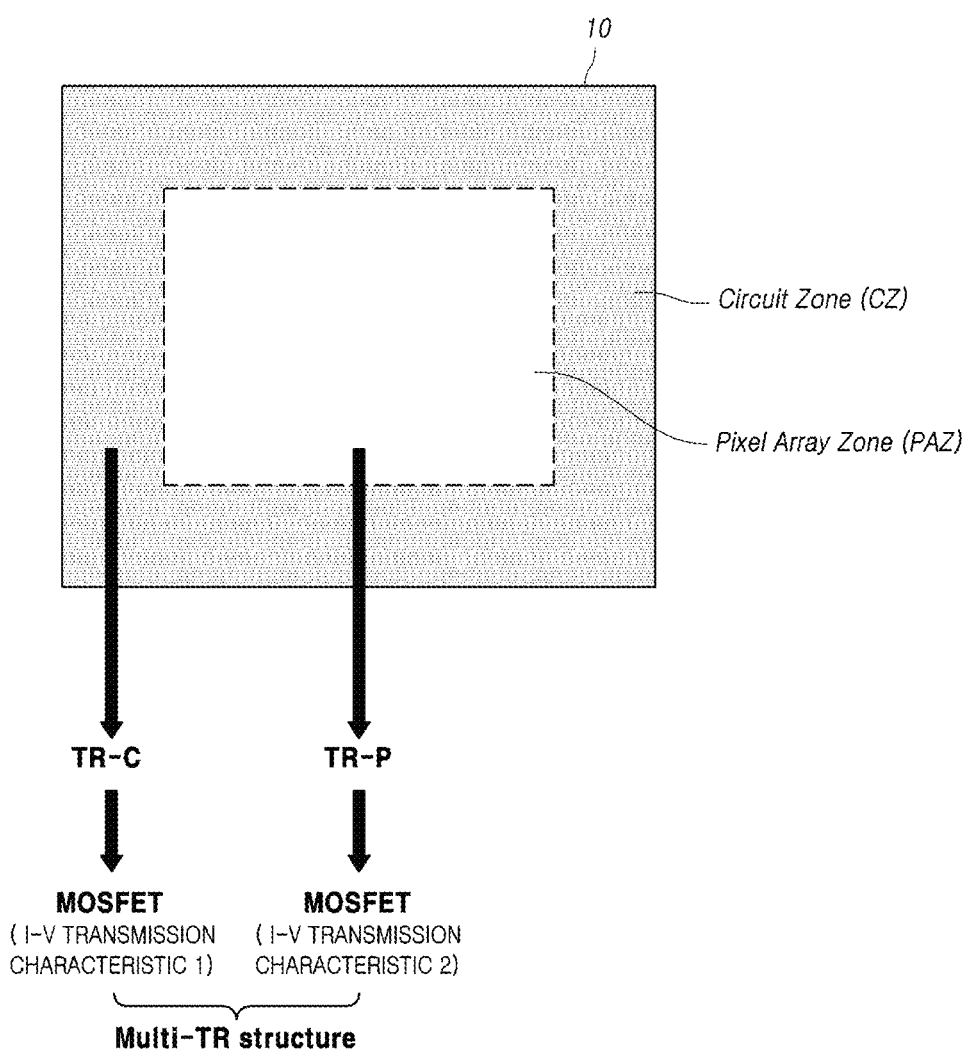
FIG. 11 is a diagram showing a second multi-transistor structure of the micro display device according to embodiments.
Figure 12:
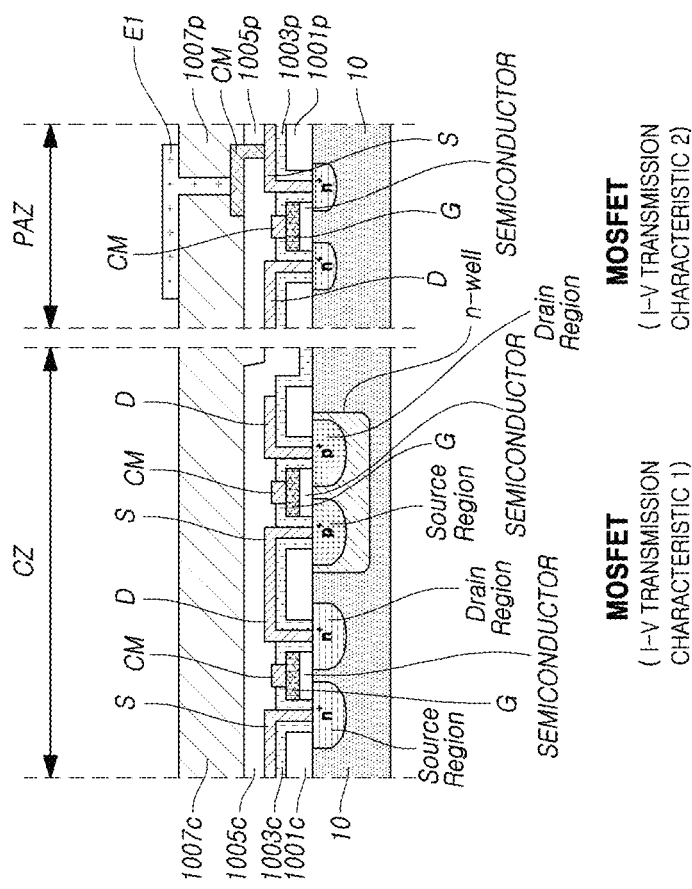
FIGS. 12 and 13 are cross-sectional views showing two exemplary second multi-transistor structure of the micro display device according to embodiments.
Figure 13:
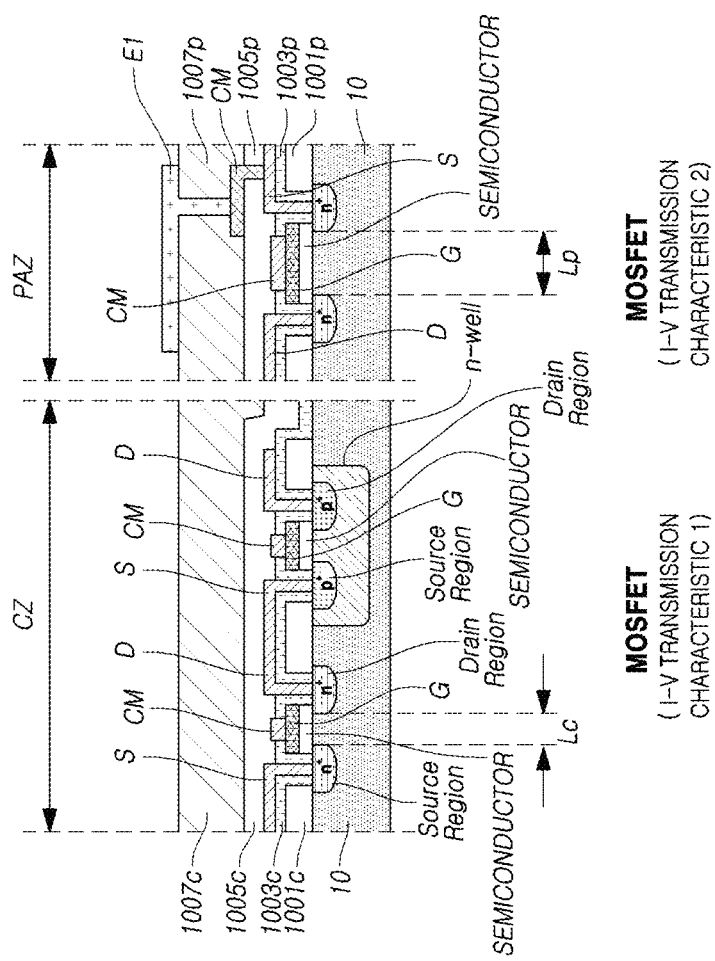

FIG. 11 is a diagram showing a second multi-transistor structure of the micro display device 1 according to embodiments. FIGS. 12 and 13 are cross-sectional views showing two exemplary second multi-transistor structure of the micro display device 1 according to embodiments.

The second multi-transistor structure is a multi-transistor structure in which the transistor TR-C in the circuit zone CZ and the transistor TR-P in the pixel array zone PAZ have different current-voltage transmission characteristics by designing the transistor TR-C in the circuit zone CZ and the transistor TR-P in the pixel array zone PAZ as the same kind of transistor, but making the detailed structure and processes different.

For example, the transistor TR-C in the circuit zone CZ and the transistor TR-P in the pixel array zone PAZ may be the same transistor type of MOSFETs.

However, the MOSFET that is the transistor TR-C in the circuit zone CZ and the MOSFET that is the transistor TR-P in the pixel array zone PAZ may have different current-voltage transmission characteristics.

As described above, when the transistor TR-C in the circuit zone CZ and the transistor TR-P in the pixel array zone PAZ are designed as the same transistor type of MOSFETs, the transistor TR-C in the circuit zone CZ and the transistor TR-P in the pixel array zone PAZ can be formed in the same process.

Referring to FIG. 12, the cross-sectional structure of the circuit zone CZ is the same as that described with reference to FIG. 10.

Referring to FIGS. 12 and 13, the pixel array zone PAZ can be formed in the same way as the circuit zone CZ.

On the silicon substrate 10, a first pixel-side insulating layer 1001p is disposed and a semiconductor is disposed in an area where there is no first pixel-side insulating layer 1001p.

A gate electrode G is disposed on the semiconductor.

A second pixel-side insulating layer 1003p is disposed over the first pixel-side insulating layer 1001p and the gate electrode G.

A source electrode S and a drain electrode D are formed by a contact hole formed through the second pixel-side insulating layer 1003p, and an n+ source region and an n+ drain region are formed at positions corresponding to the source electrode S and the drain electrode D on the silicon substrate 10.

Alternatively, depending on the channel type, a p+ source region and a p+ drain region may be formed at positions corresponding to the source electrode S and the drain electrode D on the silicon substrate 10.

A contact metal CM is connected to the gate electrode G through a contact hole formed through the second pixel-side insulating layer 1003p.

A third pixel-side insulating layer 1005c is formed thereon.

The contact metal CM can be connected to the source electrode S or the drain electrode D through a contact hole of the third pixel-side insulating layer 1005p.

A pixel-side planarization layer 1007p is formed on the third pixel-side insulating layer 1005p.

A first electrode E1 that may be the anode of an organic light emitting diode OLED is connected to the contact metal CM through the contact hole of the pixel-side planarization layer 1007p, so it can be connected to the source electrode S or the drain electrode D.

The first circuit-side insulating layer 1001c and the first pixel-side insulating layer 1001p may be the same layers that are made in the same process or may be different layers that are made in different processes.

The second circuit-side insulating layer 1003c and the second pixel-side insulating layer 1003p may be the same layers that are made in the same process or may be different layers that are made in different processes.

The third circuit-side insulating layer 1005c and the third pixel-side insulating layer 1005p may be the same layers that are made in the same process or may be different layers that are made in different processes.

The circuit-side planarization layer 1007c and the pixel-side planarization layer 1007p may be the same layers that are made in the same process or may be different layers that are made in different processes.

For reference, the planarization layers described in the specification may also be a kind of insulating layers.

As described above, in order to design the transistor TR-C in the circuit zone CZ and the transistor TR-P in the pixel array zone PAZ in the same transistor types of MOSFETs and to give different current-voltage transmission characteristics to the transistor TR-C in the circuit zone CZ and the transistor TR-P in the pixel array zone PAZ, the process may be changed (the implant condition may be adjusted) to make doping concentration different or the structure may be changed to change the channel length etc.

Referring to FIG. 12, the doping concentrations of the transistor TR-C in the circuit zone CZ and the transistor TR-P in the pixel array zone PAZ may be different from each other.

For example, the doping concentrations of the transistor TR-C in the circuit zone CZ may be higher than the doping concentration of the transistor TR-P in the pixel array zone PAZ.

As described above, by making the doping concentrations of the transistor TR-C in the circuit zone CZ and the transistor TR-P in the pixel array zone PAZ different and making the doping concentrations of the transistor TR-C in the circuit zone CZ higher than the doping concentration of the transistor TR-P in the pixel array zone PAZ, the MOSFET that is the transistor TR-C in the circuit zone CZ can have the current-voltage transmission characteristic 1 and the MOSFET that is the transistor TR-P in the pixel array zone PAZ can have the current-voltage transmission characteristic 2.

In order that the transistor TR-C in the circuit zone CZ has the current-voltage transmission characteristic 1 and the transistor TR-P in the pixel array zone PAZ has the current-voltage transmission characteristic 2, it is possible to adjust the channel characteristic value or the semiconductor characteristic value of the MOSFET that is the transistor TR-C in the circuit zone CZ and the channel characteristic value or the semiconductor characteristic value of the MOSFET that is the transistor TR-P in the pixel array zone PAZ.

For example, the channel characteristic value may include one or more of a channel length, a channel width, and a channel thickness. The semiconductor characteristic value may include one or more a semiconductor length, a semiconductor width, and a semiconductor thickness.

The current-voltage transmission characteristics may be controlled, using not only the channel characteristic values, but various methods that can be used in the electronic circuit field.

Referring to FIG. 13, the channel length Lc of the transistor TR-C in the circuit zone CZ or a semiconductor length corresponding to the channel length Lc and the channel length Lp of the transistor TR-P in the pixel array zone PAZ or a semiconductor length corresponding to the channel length Lp may be different from each other.

For example, the channel length Lc of the transistor TR-C in the circuit zone CZ or the semiconductor length corresponding to the channel length Lc may be smaller than the channel length Lp of the transistor TR-P in the pixel array zone PAZ or the semiconductor length corresponding to the channel length Lp.

The channel width or the channel thickness (semiconductor width or semiconductor thickness) of the transistor TR-C in the circuit zone CZ and the channel width or the channel thickness (semiconductor width or semiconductor thickness) of the transistor TR-P in the pixel array zone PAZ may be different from each other.

For example, the channel width or the channel thickness (semiconductor width or semiconductor thickness) of the transistor TR-C in the circuit zone CZ may be larger than the channel width or the channel thickness (semiconductor width or semiconductor thickness) of the transistor TR-P in the pixel array zone PAZ.

As described above, by making the channel length (or semiconductor length) of the transistor TR-C in the circuit zone CZ and the channel length (or semiconductor length) of the transistor TR-P in the pixel array zone PAZ different and making the channel length (or semiconductor length) of the transistor TR-C in the circuit zone CZ smaller than the channel length (or semiconductor length) of the transistor TR-P in the pixel array zone PAZ the MOSFET that is the transistor TR-C in the circuit zone CZ can have the current-voltage transmission characteristic 1 and the transistor TR-P in the pixel array zone PAZ can have the current-voltage transmission characteristic 2.

Figure 14:
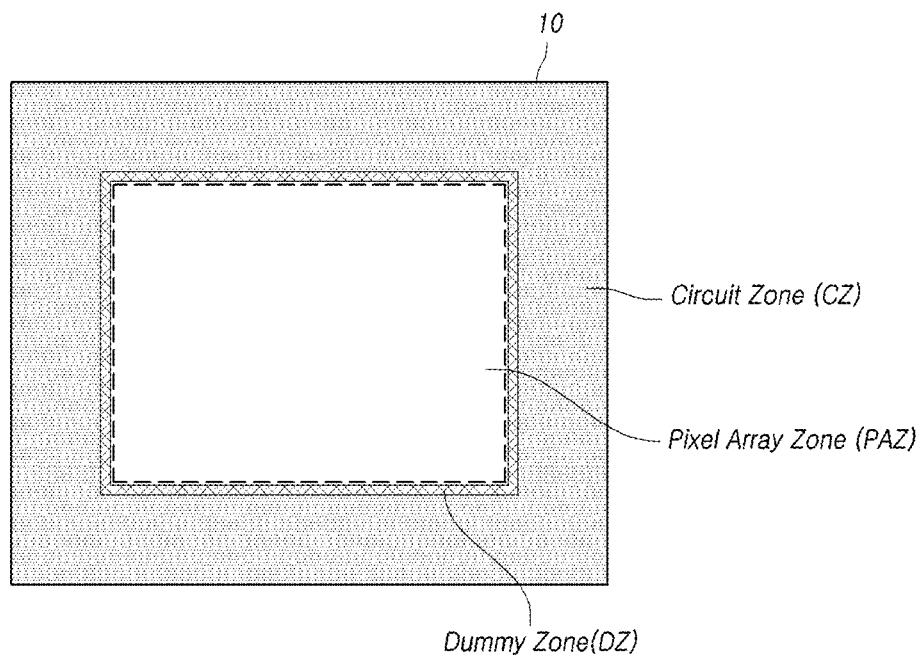
FIG. 14 is a diagram showing three zones of a silicon substrate of a micro display device according to embodiments.
Figure 15:
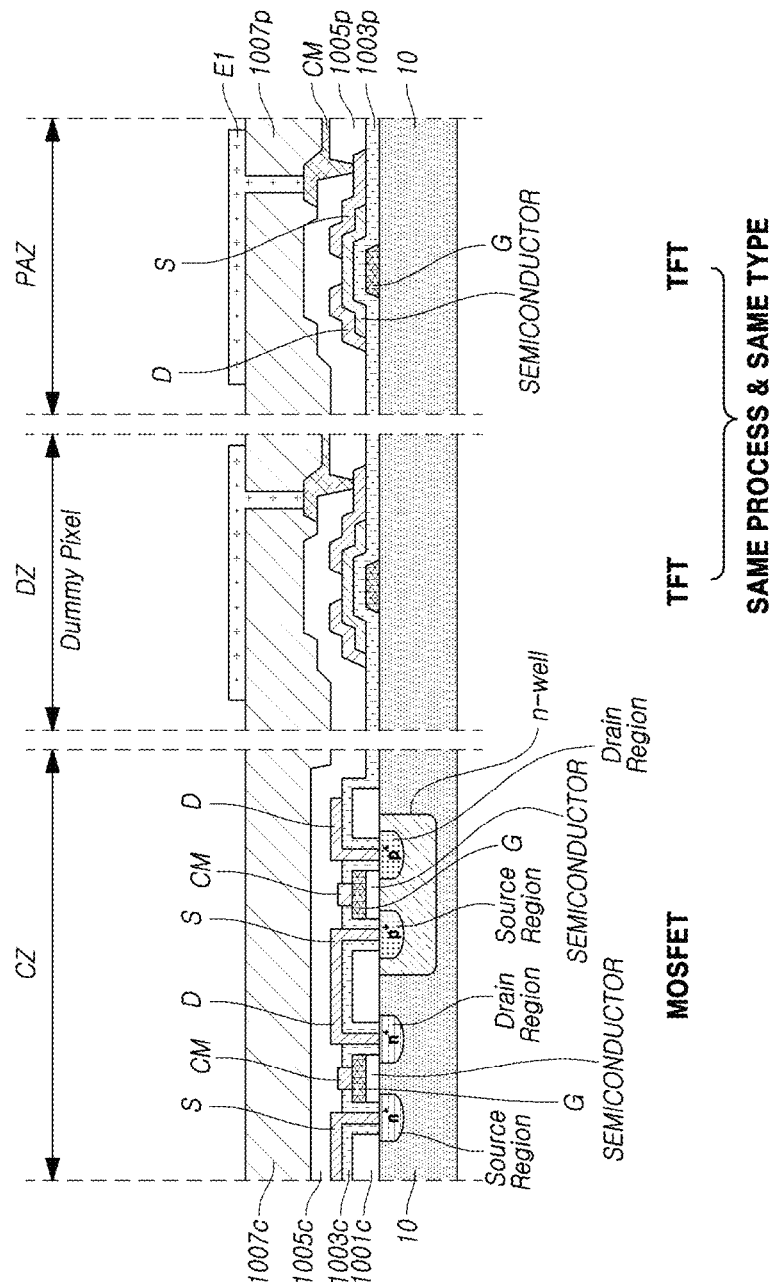
FIG. 15 is a cross-sectional view of a circuit zone, a dummy zone, and a pixel array zone in the first multi-transistor structure of the micro display device according to embodiments.
Figure 16:
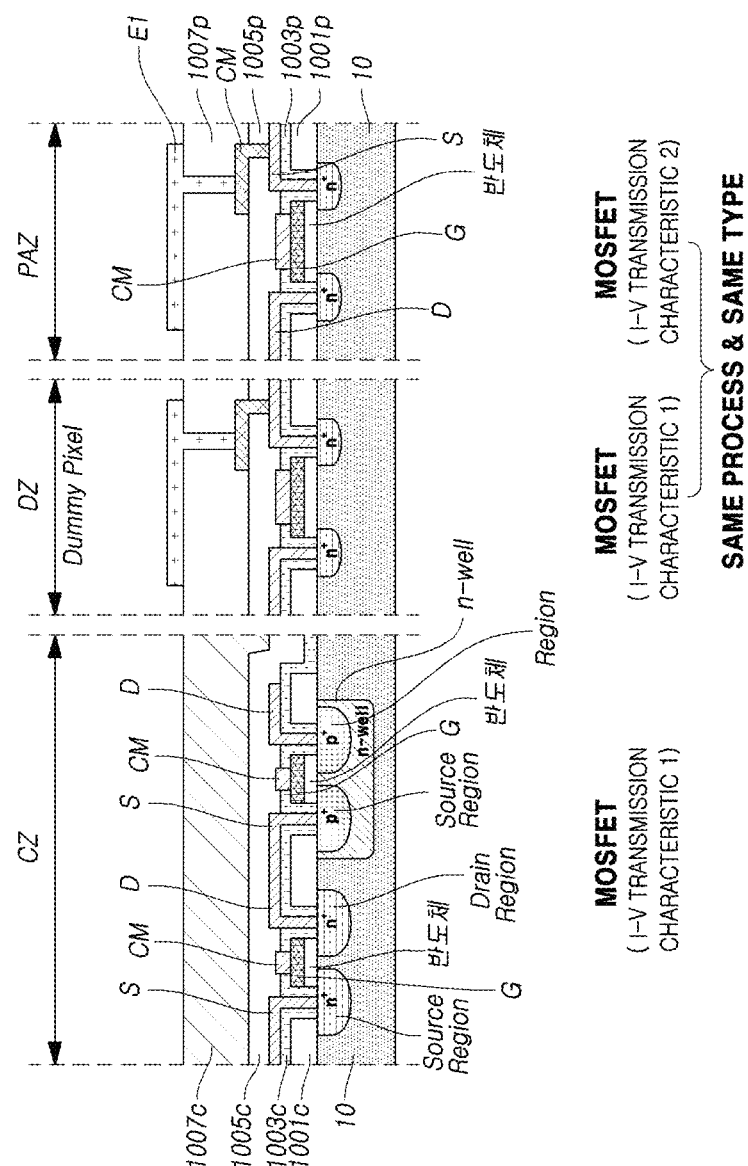
FIG. 16 is a cross-sectional view of a circuit zone, a dummy zone, and a pixel array zone in the second multi-transistor structure of the micro display device according to embodiments.

FIG. 14 is a diagram showing three zones of the silicon substrate 10 of the micro display device 1 according to embodiments. FIG. 15 is a cross-sectional view of a circuit zone CZ, a dummy zone DZ, and a pixel array zone PAZ in a first multi-transistor structure of the micro display device 1 according to embodiments. FIG. 16 is a cross-sectional view of a circuit zone CZ, a dummy zone DZ, and a pixel array zone PAZ in a second multi-transistor structure of the micro display device 1 according to embodiments.

Referring to FIG. 14, in the silicon substrate 10, a dummy zone DZ may exist between the circuit zone CZ and the pixel array zone PAZ.

A pixel electrode (which may correspond to a first electrode E1) disposed in the pixel array zone PAZ may exist in the dummy zone DZ of the silicon substrate 10.

Depending on cases, as shown in FIGS. 15 and 16, dummy pixels including a pixel electrode (which may correspond to the first electrode E1) and a transistor having the same current-voltage transmission characteristic as that of the transistor TR-P disposed in the pixel array zone PAZ may exist in the dummy zone DZ of the silicon substrate 10.

The transistors disposed in the dummy pixels may be made in the same type through the same process as those of the transistor TR-P in the pixel array zone PAZ.

As shown in FIG. 15, the transistors disposed in the dummy pixels may be made in the same type through the same process as those of a TFT that is the transistor TR-P in the pixel array zone PAZ.

As shown in FIG. 16, the transistors disposed in the dummy pixels may be made in the same type through the same process as those of a MOSFET that is the transistor TR-P in the pixel array zone PAZ.

The transistors and various electrodes disposed in the dummy pixels substantially do not perform a switch operation.

Various dummy wires may be disposed in the dummy zone DZ of the silicon substrate 10, and a signal and voltage may not be applied to the dummy wires.

Specific voltage (e.g., ground voltage) may be applied to the electrodes and dummy wires in the dummy zone DZ of the silicon substrate 10 for voltage stabilization etc. unless it has a bad influence on the display operation of the pixel array 100.

Transmission signal wires for transmitting voltage or signals from driver circuits to the pixel array 100 may be disposed in the dummy zone DZ of the silicon substrate 10.

If there is no dummy zone DZ between the circuit zone CZ and the pixel array zone PAZ, various electrodes, various wires, transistors, and sub-pixels existing outside the pixel array 100 may be slightly different in shape, structure, physical property, and characteristic from various electrode, various wires, transistors, and sub-pixels existing inside the pixel array 100 when various electrodes, various wires, transistors, and sub-pixels are formed in the pixel array zone PAZ. Accordingly, the display performance may also be deteriorated.

However, as described above, since there is the dummy zone between the circuit zone CZ and the pixel array zone PAZ and the pixel array zone PAZ is extended to the dummy zone DZ, various electrodes, various wires, transistors, and sub-pixels existing outside the pixel array 100 can be maintained to be the same in shape, structure, physical property, and characteristic from various electrode, various wires, transistors, and sub-pixels existing inside the pixel array 100. Accordingly, the display performance can also be improved.

Figure 17:
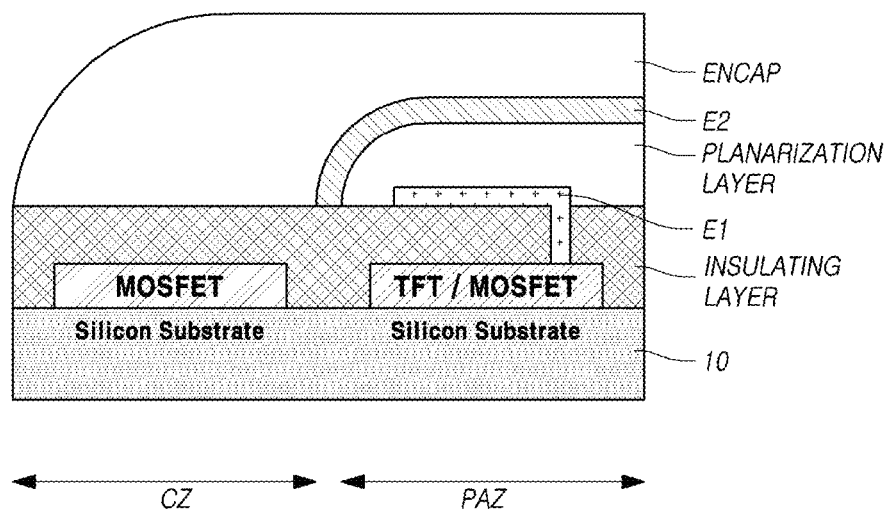
FIG. 17 is a cross-sectional view showing a portion where an organic light emitting diode and an encapsulation layer are formed in the micro display device according to embodiments.

FIG. 17 is a cross-sectional view showing a portion where an organic light emitting diode OLED and an encapsulation layer ENCAP are formed in the micro display device 1 according to embodiments.

As described above, a MOSFET is formed in the circuit zone CZ of the silicon substrate 10 and a TFT or a MOSFET is formed in the pixel array zone PAZ of the silicon substrate 10.

For example, after a MOSFET is formed in the circuit zone CZ of the silicon substrate 10 and a TFT or a MOSFET is formed in the pixel array zone PAZ of the silicon substrate 10, an insulating layer may be formed and the first electrode E1 of the organic light emitting diode OLED may be electrically connected to the TFT or the MOSFET in the pixel array zone PAZ through a contact hole of the insulating layer.

Further, a planarization layer may be formed over the first electrode E1 corresponding to the anode (or cathode) of the organic light emitting diode OLED in the pixel array zone PAZ.

A second electrode E2 corresponding to the cathode (or anode) of the organic light emitting diode OLED is formed on the planarization layer in the pixel array zone PAZ.

An encapsulation layer ENCAP for preventing permeation of water, air etc. may exist in both of the circuit zone CZ and the pixel array zone PAZ of the silicon substrate 10.

In other words, an encapsulation layer ENCAP may be disposed on the second electrode E2 and may extend from the pixel array zone PAZ to the circuit zone CZ.

As described above, since the encapsulation layer ENCAP extends from the pixel array zone PAZ to the circuit zone CZ, it is possible to protect not only the pixel array 100 in the pixel array zone PAZ, but the driver circuits in the circuit zone CZ from water, air etc.

FIGS. 18 to 21 show examples of processes of forming a transistor TR-C in the circuit zone CZ, a transistor TR-P and a pixel electrode in the pixel array zone PAZ in the micro display device 1 according to embodiments.

Figure 18:
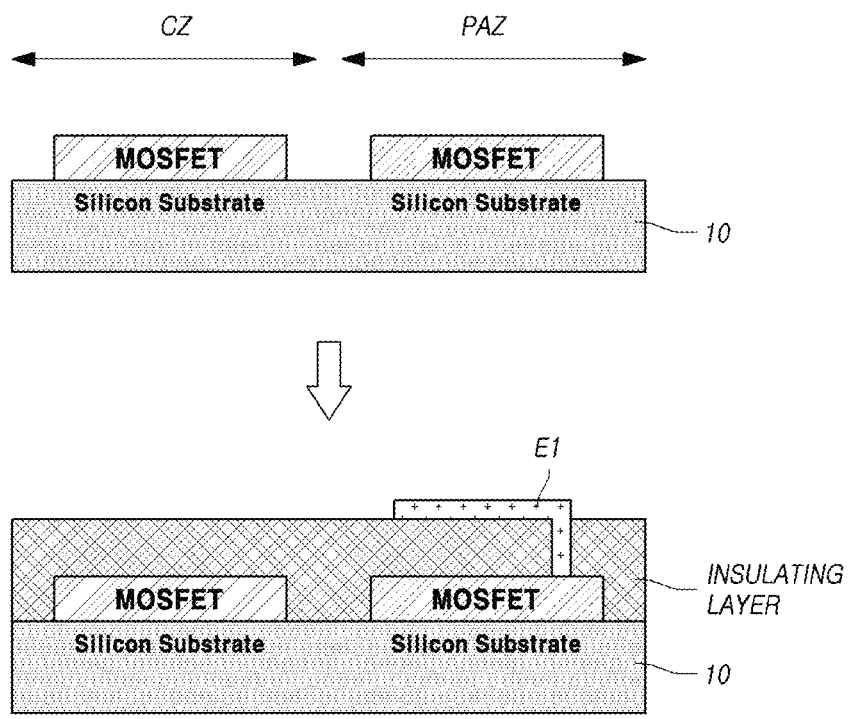
FIGS. 18 to 21 show examples of processes of forming a transistor in the circuit zone, a transistor and a pixel electrode in the pixel array zone in the micro display device according to embodiments.

Referring to FIG. 18, a manufacturing process (Process 1) of the second multi-transistor structure may be progressed as a first step of simultaneously forming a MOSFET in the circuit zone CZ of the silicon substrate 10 and a MOSFET in the pixel array zone PAZ of the silicon substrate 10 in the same process and a second step of forming an insulating layer and putting an organic light emitting diode OLED on the insulating layer.

The first step and second step both can be performed by a display manufacturer or a semiconductor foundry manufacturer.

Depending on cases, the first step may be performed by a semiconductor foundry manufacturer and the second step may be performed by a display manufacturer.

Figure 19:
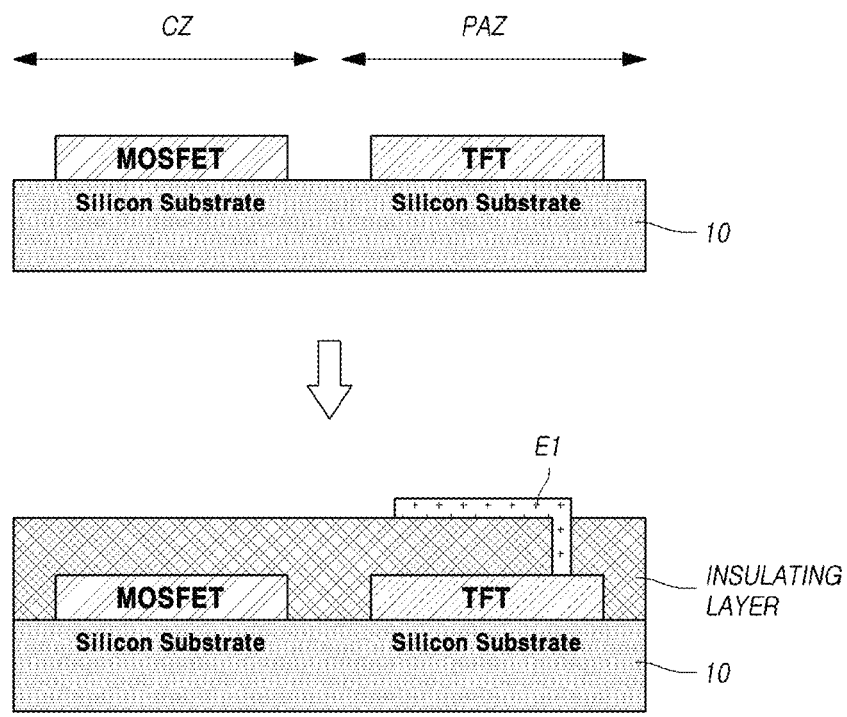

Referring to FIG. 19, a manufacturing process (Process 2) of the first multi-transistor structure may be progressed as a first step of simultaneously or separately forming a MOSFET in the circuit zone CZ and a TFT in the pixel array zone PAZ of the silicon substrate 10 and a second step of forming an insulating layer and putting an organic light emitting diode OLED on the insulating layer.

The first step and second step both can be performed by a display manufacturer or a semiconductor foundry manufacturer.

Depending on cases, the first step may be performed by a semiconductor foundry manufacturer and the second step may be performed by a display manufacturer.

According to the manufacturing processes (Process 1 and 2) of FIGS. 18 and 19, transistors may be formed in the same step in the circuit zone CZ and the pixel array zone PAZ of the silicon substrate 10.

Figure 20:
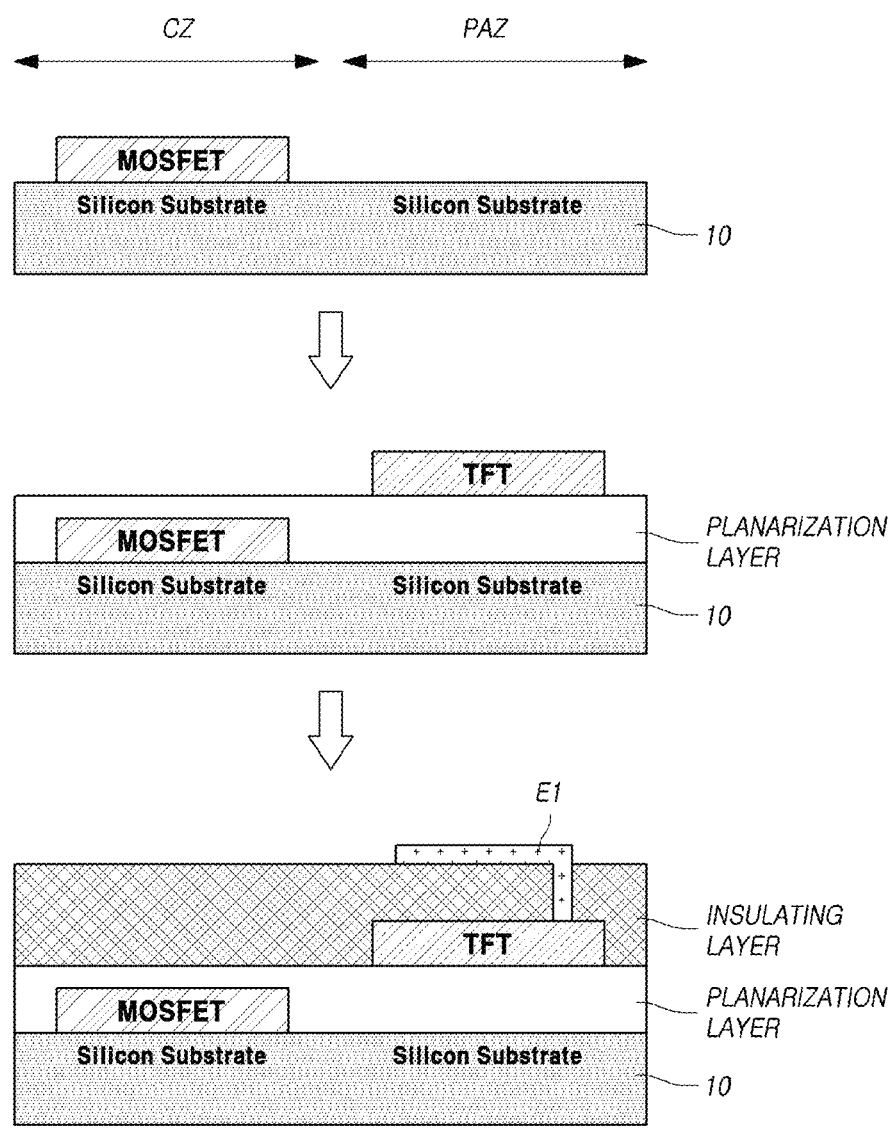

Referring to FIG. 20, another manufacturing process (Process 3) of the first multi-transistor structure may be processed as a first step of forming a MOSFET etc. in the circuit zone CZ of the silicon substrate 10, a second step of forming a planarization layer and then forming a TFT at a corresponding position in the pixel array zone PAZ of the silicon substrate 10, and a third step of putting an organic light emitting diode OLED on it.

The first step, second step, and third step can be all performed by a display manufacturer or a semiconductor foundry manufacturer.

Depending on cases, the first step may be performed by a semiconductor foundry manufacturer and the second and third steps may be performed by a display manufacturer.

The manufacturing process (Process 3) of FIG. 20 is a method of forming a MOSFET etc. first in the circuit zone CZ of the silicon substrate 10 and then forming the TFT in the pixel array zone PAZ of the silicon substrate 10.

Figure 21:
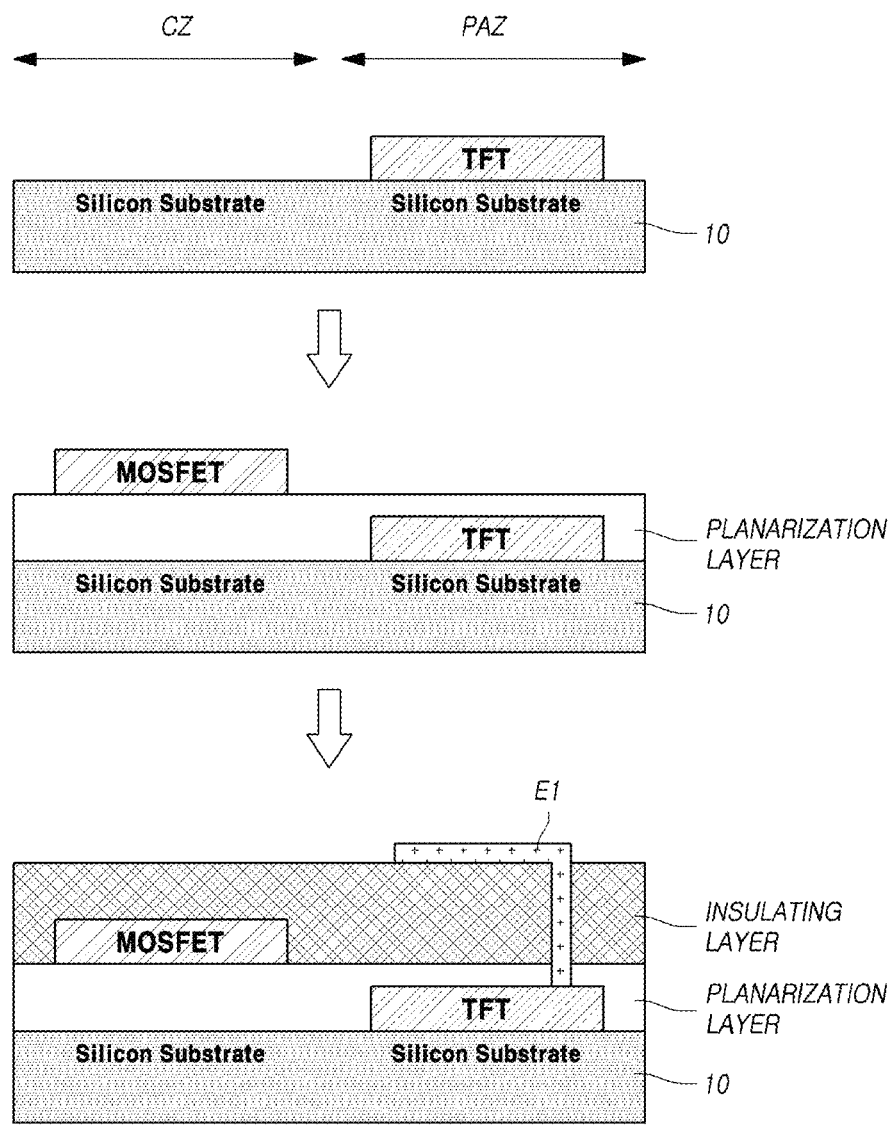

Referring to FIG. 21, another manufacturing process (Process 4) of the first multi-transistor structure may be processed as a first step of forming a TFT in the pixel array zone PAZ of the silicon substrate 10, a second step of forming a planarization layer and then forming a MOSFET etc. at a corresponding position over the planarization layer in the circuit zone CZ of the silicon substrate 10, and a third step of forming an insulating layer and putting an organic light emitting diode OLED on the insulating layer.

The first step, second step, and third step can be all performed by a display manufacturer or a semiconductor foundry manufacturer.

Depending on cases, the first step may be performed by a display manufacturer, the second step may be performed by a semiconductor foundry manufacturer, and the third step may be performed by a display manufacturer.

The manufacturing process (Process 4) of FIG. 21 is a method of forming a TFT first in the pixel array zone PAZ of the silicon substrate 10 and then forming a MOSFET in the circuit zone CZ of the silicon substrate 10.

Figure 22:
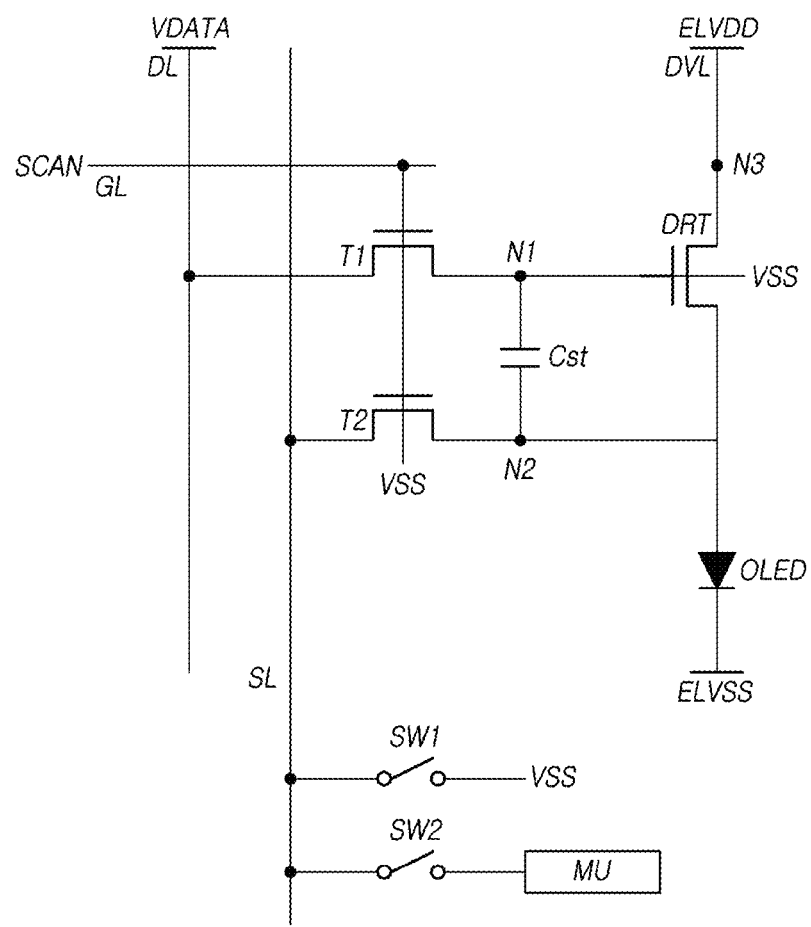
FIGS. 22 and 23 are other exemplary diagrams showing the structure of a sub-pixel of the micro display device according to embodiments.
Figure 23:
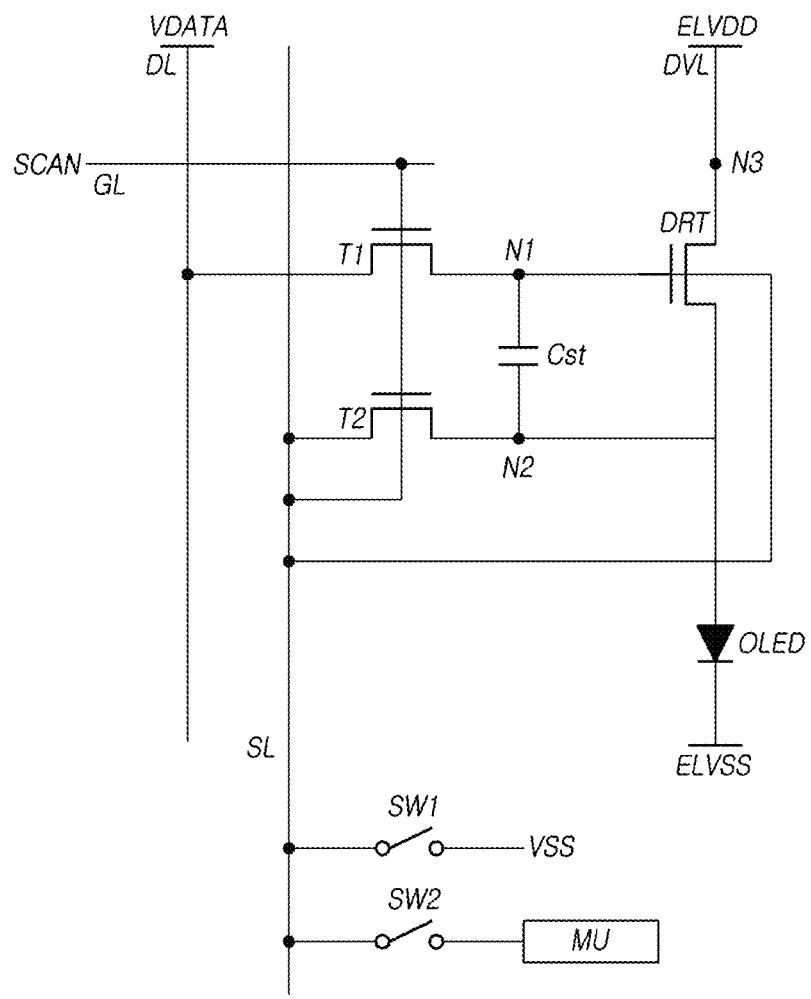

FIGS. 22 and 23 are other exemplary diagrams showing the structure of a sub-pixel of the micro display device 1 according to embodiments.

Referring to FIG. 22, in the structure of a sub-pixel of FIG. 5, reference voltage VSS can be applied to a sense line SL through a first switch SW1.

It is possible to control the voltage state of the sense line SL in accordance with a driving timing through the first switch SW1. Accordingly, it is also possible to control the voltage state of a second node N2 of a driver transistor DRT.

The sense line SL may be connected to a monitoring unit MU through a second switch SW2.

When the second switch SW2 is turned on and the monitoring unit MU is electrically connected to the sense line SL, the monitoring unit MU can measure voltage or current of the sense line SL.

The degree of deterioration of the sub-pixel or the electrical state of the sub-pixel can be sensed from the voltage or current of the sense line SL.

The degree of deterioration of the sub-pixel, for example, may be the threshold voltage or mobility of the driver transistor DRT, and depending on cases, it may be degree of deterioration of an organic light emitting diode OLED.

The electrical state of the sub-pixel, for example, may be a short-circuit or an open state of the first electrode E1 and the second electrode E2 of an organic light emitting diode OLED.

The monitoring unit MU may be included in the source driver circuit 110 or another driver circuit and may be implemented as an Analog to Digital Converter (ADC) or a current sensor etc.

Referring to FIG. 22, it is possible to apply reference voltage VSS as body voltage to the body of at least one of a driver transistor DRT, a first transistor T1, and a second transistor T2.

In order to apply reference voltage VSS as body voltage to the body of at least one of the driver transistor DRT, the first transistor T1, and the second transistor T2, as shown in FIG. 23, it may be possible to electrically connect the body of at least one of the driver transistor DRT, the first transistor T1, and the second transistor T2 to the sense line SL.

All the transistors disposed in the pixel array zone PAZ of the silicon substrate 10 may be different in current-voltage transmission characteristic from the transistor in the circuit zone CZ of the silicon substrate 10.

Depending on cases, some of the transistors disposed in the pixel array zone PAZ of the silicon substrate 10 may be different in current-voltage transmission characteristic from the transistor in the circuit zone CZ of the silicon substrate 10, but some other transistors disposed in the pixel array zone PAZ of the silicon substrate 10 may be the same or substantially the same in current-voltage transmission characteristic as the transistor in the circuit zone CZ of the silicon substrate 10.

For example, the driver transistor DRT, the first transistor T1, and the second transistor T2 in a sub-pixel formed in the pixel array zone PAZ of the silicon substrate 10 may be all different in current-voltage transmission characteristic from the transistor in the circuit zone CZ of the silicon substrate 10.

Alternatively, the driver transistor DRT in a sub-pixel SP formed in the pixel array zone PAZ of the silicon substrate 10 may be different in current-voltage transmission characteristic from the transistor in the circuit zone CZ of the silicon substrate 10, but at least one of the first transistor T1 and the second transistor T2 in a sub-pixel SP formed in the pixel array zone PAZ of the silicon substrate 10 may be the same in current-voltage transmission characteristic as the transistor in the circuit zone CZ of the silicon substrate 10.

That is, the driver transistor DRT, the first transistor T1, and the second transistor T2 in a sub-pixel SP formed in the pixel array zone PAZ of the silicon substrate 10 may be all the same kind of transistors (e.g., TFTs or MOSFETs).

Alternatively, the kind (e.g., a TFT) of at least one (e.g., the driver transistor DRT) of the driver transistor DRT, the first transistor T1, and the second transistor T2 in a sub-pixel SP formed in the pixel array zone PAZ of the silicon substrate 10 may be different from the kind (e.g., a MOSFET) of the other transistors (e.g., the first and second transistors T1 and T2).

That is, the driver transistor DRT, the first transistor T1, and the second transistor T2 in a sub-pixel formed in the pixel array zone PAZ of the silicon substrate 10 may be all the same in channel characteristic value (e.g., channel length, channel width, and channel thickness).

Alternatively, the channel characteristic values (e.g., the channel length, channel width, and channel thickness) of at least one (e.g., the driver transistor DRT) of the driver transistor DRT, the first transistor T1, and the second transistor T2 in a sub-pixel formed in the pixel array zone PAZ of the silicon substrate 10 may be different from the channel characteristic values (e.g., the channel length, channel width, and channel thickness) of the other transistors (e.g., the first and second transistors T1 and T2).

The micro display device 1 according to various embodiments described above may be called a micro display panel or a micro display module or may be an electronic device including a micro display panel or a micro display module.

The micro display device 1 according to various embodiments described above may be included in a virtual reality device or an augmented reality device.

The embodiments described above can provide a micro display device 1 and a display integrated circuit.

The embodiments can provide a micro display device 1 and a display integrated circuit that have excellent driving ability and display performance.

The embodiments can provide a micro display device 1 and a display integrated circuit in which a pixel array 100 and driver circuits are all disposed on a silicon substrate.

The embodiments can provide a micro display device 1 and a display integrated circuit that have a multi-transistor characteristic.

The embodiments can provide a micro display device 1 and a display integrated circuit that have a multi-transistor structure.

It will be apparent to those skilled in the art that various modifications and variations can be made in the micro display device and the display integrated circuit of the present disclosure without departing from the technical idea or scope of the disclosure. Thus, it is intended that the present disclosure cover the modifications and variations of this disclosure provided they come within the scope of the appended claims and their equivalents.

What is claimed is:

1. A micro display device, comprising:
   a silicon substrate;
   a pixel array including a plurality of sub-pixels arranged in a pixel array zone of the silicon substrate; and
   driver circuits disposed in a circuit zone of the silicon substrate,
   wherein the circuit zone is positioned around the pixel array zone of the silicon substrate,
   wherein all or some of transistors in the pixel array zone and transistors in the circuit zone have different current-voltage transmission characteristics,
   wherein the current-voltage transmission characteristics of the transistors in the circuit zone are defined as a first current-voltage transmission graph showing a current change according to a voltage change,
   wherein the current-voltage transmission characteristics of the transistors in the pixel array zone are defined as a second current-voltage transmission graph showing a current change according to a voltage change, and
   wherein the slope in a current change section in the second current-voltage transmission graph is smaller than the slope in a current change section in the first current-voltage transmission graph.

2. The micro display device of claim 1, wherein transistors in the circuit zone are Metal-Oxide-Semiconductor Field-Effect Transistors (MOSFET) and the transistors in the pixel array zone are Thin Film Transistors (TFT).

3. The micro display device of claim 1, wherein the transistors in the pixel array zone are one of an amorphous silicon TFT, a poly silicon TFT, an oxide TFT, and an organic TFT.

4. The micro display device of claim 1, wherein the transistors in the circuit zone and the transistors in the pixel array zone are MOSFETs having different current-voltage transmission characteristics.

5. The micro display device of claim 1, wherein a dummy zone exists between the circuit zone and the pixel array zone on the silicon substrate, and
   a dummy pixel including a pixel electrode and a transistor having the same current-voltage transmission characteristic as the transistors in the pixel array zone exists in the dummy zone of the silicon substrate.

6. The micro display device of claim 1, wherein the driver circuits include a source driver circuit, a gate driver circuit, a control driver circuit, and a power circuit.

7. The micro display device of claim 1, wherein the sub-pixels each include:
   an organic light emitting diode having a first electrode and a second electrode;
   a driver transistor configured to drive the organic light emitting diode;
   a first transistor electrically connected between a data line and a first node that is a gate node of the driver transistor; and
   a capacitor electrically connected between the first node of the driver transistor and a second node that is a source node or a drain node of the driver transistor,
   an encapsulation layer is disposed on the second electrode, and
   the encapsulation layer extends from the pixel array zone to the circuit zone.

8. The micro display device of claim 7, wherein the sub-pixels each further include a second transistor electrically connected between the second node of the driver transistor and a sense line.

9. The micro display device of claim 8, wherein the first transistor and the second transistor in the pixel array zone are different in current-voltage transmission characteristic from the transistors in the circuit zone.

10. The micro display device of claim 8, wherein one or more of the first transistor and the second transistor in the pixel array zone are the same in current-voltage transmission characteristic as the transistors in the circuit zone.

11. The micro display device of claim 7, wherein the driver transistor in the pixel array zone is different in current-voltage transmission characteristic from the transistors in the circuit zone.

12. A micro display device, comprising:
    a silicon substrate;
    a pixel array including a plurality of sub-pixels arranged in a pixel array zone of the silicon substrate; and
    driver circuits disposed in a circuit zone of the silicon substrate,
    wherein the circuit zone is positioned around the pixel array zone of the silicon substrate,
    wherein all or some of transistors in the pixel array zone and transistors in the circuit zone have different current-voltage transmission characteristics, and
    wherein channel characteristic values of the transistors in the circuit zone and channel characteristic values of the transistors in the pixel array zone are different from each other, and the channel characteristic values include one or more of a channel length, a channel width, and a channel thickness.

13. The micro display device of claim 12, wherein the channel length of the transistors in the circuit zone is smaller than the channel length of the transistors in the pixel array zone, and
the channel width or the channel thickness of the transistors in the circuit zone is larger than the channel width or the channel thickness of the transistors in the pixel array zone.

14. A display integrated circuit, comprising:
a silicon substrate;
a plurality of sub-pixels arranged in a pixel array zone of the silicon substrate; and
driver circuits disposed in a circuit zone of the silicon substrate,
wherein the circuit zone is positioned around the pixel array zone,
wherein transistors in the pixel array zone and transistors in the circuit zone have different current-voltage transmission characteristics, and
wherein the doping concentration of the transistors in the pixel array zone and the doping concentration of the transistors in the circuit zone are different from each other.

15. The display integrated circuit of claim 14, wherein the doping concentration of the transistors in the circuit zone is higher than the doping concentration of the transistors in the pixel array zone.

16. The display integrated circuit of claim 14, wherein the transistors in the pixel array zone and the transistors in the circuit zone are different kinds of transistors.

17. The display integrated circuit of claim 14, wherein the transistors in the pixel array zone and the transistors in the circuit zone are the same kind of transistors.

18. The display integrated circuit of claim 17, wherein channel characteristic values of the transistors in the pixel array zone and the channel characteristic values of the transistors in the circuit zone are different from each other.

* * * * *